(12) United States Patent
Kondo et al.

(10) Patent No.: US 10,629,328 B2
(45) Date of Patent: Apr. 21, 2020

(54) INSULATING COATING MATERIAL HAVING EXCELLENT WEAR RESISTANCE

(71) Applicant: KANEKA CORPORATION, Osaka-shi (JP)

(72) Inventors: Yasutaka Kondo, Otsu (JP); Makoto Tawada, Otsu (JP); Kazuhiro Ono, Otsu (JP)

(73) Assignee: KANEKA CORPORATION, Osaka-shi (JP)

(*) Notice: Subject to any disclaimer, the term of this patent is extended or adjusted under 35 U.S.C. 154(b) by 0 days.

(21) Appl. No.: 15/606,508

(22) Filed: May 26, 2017

(65) Prior Publication Data
US 2017/0271044 A1 Sep. 21, 2017

Related U.S. Application Data

(63) Continuation of application No. PCT/JP2015/082304, filed on Nov. 17, 2015.

(30) Foreign Application Priority Data

Nov. 27, 2014 (JP) ................. 2014-240248
Nov. 27, 2014 (JP) ................. 2014-240249
Nov. 27, 2014 (JP) ................. 2014-240250

(51) Int. Cl.
*B32B 41/00* (2006.01)
*H01B 7/02* (2006.01)
(Continued)

(52) U.S. Cl.
CPC ........... *H01B 7/0216* (2013.01); *B29C 63/04* (2013.01); *B32B 7/02* (2013.01); *B32B 27/34* (2013.01);
(Continued)

(58) Field of Classification Search
CPC ...... H01B 7/0216; H01B 3/445; H01B 13/08; H01B 3/306; H01B 7/02; H01B 3/30;
(Continued)

(56) References Cited

U.S. PATENT DOCUMENTS 4,801,506 A 1/1989 Motonari et al.
5,006,411 A 4/1991 Motonari et al.
(Continued)

FOREIGN PATENT DOCUMENTS

CN 101939796 A 1/2011
CN 102575034 A 7/2012
(Continued)

OTHER PUBLICATIONS

International Search Report dated Aug. 19, 2014 in PCT/JP2014/063944.

(Continued)

*Primary Examiner* — Michael N Orlando
*Assistant Examiner* — Joshel Rivera
(74) *Attorney, Agent, or Firm* — Oblon, McClelland, Maier & Neustadt, L.L.P.

(57) ABSTRACT

An insulating coating material including an insulating film, and an adhesion layer on at least one side of an insulating film. The insulating film satisfies Formula (1) $a = k \times b^3$ ... Formula (1) where a is a loop stiffness value in g/cm of the insulating film, b is a thickness in μm of the insulating film, and k is 0.000105 or more.

20 Claims, 6 Drawing Sheets

Cross-sectional image of a laminate obtained when an insulating coating material having an adhesion layer on one side of an insulating film is used Cross-sectional image of a laminate obtained when an insulating coating material having an adhesion layer on both sides of an insulating film is used

(51) Int. Cl.

| | | |
|---|---|---|
| *H01B 3/30* | (2006.01) | |
| *B32B 7/02* | (2019.01) | |
| *H01B 17/56* | (2006.01) | |
| *H01B 17/60* | (2006.01) | |
| *B32B 27/34* | (2006.01) | |
| *H01B 3/44* | (2006.01) | |
| *B29C 63/04* | (2006.01) | |
| *G01N 3/56* | (2006.01) | |
| *H01B 13/00* | (2006.01) | |
| *H01B 13/08* | (2006.01) | |
| *B29L 31/34* | (2006.01) | |

(52) U.S. Cl.
CPC ............ *G01N 3/56* (2013.01); *H01B 3/30* (2013.01); *H01B 3/306* (2013.01); *H01B 3/445* (2013.01); *H01B 7/02* (2013.01); *H01B 13/0036* (2013.01); *H01B 13/08* (2013.01); *H01B 17/56* (2013.01); *H01B 17/60* (2013.01); *B29L 2031/3462* (2013.01)

(58) Field of Classification Search
CPC ........ H01B 17/60; H01B 17/56; B29C 63/04; G01N 3/56; B32B 7/02; B32B 27/34; B29L 2031/3462
USPC .................... 156/60, 64, 350, 351, 378, 379
See application file for complete search history.

(56) References Cited

U.S. PATENT DOCUMENTS

| | | | |
|---|---|---|---|
| 5,731,088 A | 3/1998 | La Court | |
| 5,859,171 A | 1/1999 | Sawasaki et al. | |
| 6,127,509 A | 10/2000 | Pratte et al. | |
| 7,018,704 B2 | 3/2006 | Kaneshiro et al. | |
| 7,022,402 B2 | 4/2006 | Lacourt | |
| 2003/0062190 A1 | 4/2003 | Kim et al. | |
| 2004/0081808 A1 | 4/2004 | Kaneshiro et al. | |
| 2005/0013998 A1 | 1/2005 | Lacourt | |
| 2007/0009751 A1* | 1/2007 | Hwang ................ | B82Y 30/00 428/473.5 |
| 2009/0297858 A1 | 12/2009 | Glenn et al. | |
| 2010/0209681 A1 | 8/2010 | Lee et al. | |
| 2010/0282488 A1 | 11/2010 | Zheng et al. | |
| 2012/0156482 A1 | 6/2012 | Hisano et al. | |
| 2012/0222884 A1 | 9/2012 | Honda et al. | |
| 2012/0227790 A1 | 9/2012 | Auman et al. | |
| 2012/0228616 A1 | 9/2012 | Auman et al. | |
| 2012/0231257 A1 | 9/2012 | Dunbar et al. | |
| 2012/0231263 A1 | 9/2012 | Auman et al. | |
| 2012/0231264 A1 | 9/2012 | Auman et al. | |
| 2012/0292086 A1 | 11/2012 | Auman et al. | |
| 2013/0233590 A1 | 9/2013 | Shanai et al. | |
| 2014/0102752 A1 | 4/2014 | Ushiwata et al. | |
| 2016/0075916 A1 | 3/2016 | Kondo et al. | |

FOREIGN PATENT DOCUMENTS

| | | |
|---|---|---|
| CN | 102791769 A | 11/2012 |
| CN | 103302936 | 9/2013 |
| EP | 0 811 483 A1 | 12/1997 |
| EP | 1 498 909 A1 | 1/2005 |
| EP | 2 503 558 a1 | 9/2012 |
| JP | 62-162542 A | 7/1987 |
| JP | 62-162543 A | 7/1987 |
| JP | 2-103804 A | 4/1990 |
| JP | 4-303649 A | 10/1992 |
| JP | 4-303652 A | 10/1992 |
| JP | 7-37439 A | 2/1995 |
| JP | 10-100340 A | 4/1998 |
| JP | 11-58543 A | 3/1999 |
| JP | 2001-508588 A | 6/2001 |
| JP | 2004-216830 | 8/2004 |
| JP | 2004-533092 | 10/2004 |
| JP | 2005-35300 A | 2/2005 |
| JP | 2007-30501 A | 2/2007 |
| JP | 2007-077231 A | 3/2007 |
| JP | 2008-16603 A | 1/2008 |
| JP | 2008-028488 A | 2/2008 |
| JP | 2009-518500 A | 5/2009 |
| JP | 2012-195290 A | 10/2012 |
| JP | 2013-030421 A | 2/2013 |
| JP | 2013-051030 A | 3/2013 |
| JP | 2013-512535 A | 4/2013 |
| JP | 2013-089585 A | 5/2013 |
| JP | 2014-82083 A | 5/2014 |
| JP | 2014-102946 A | 6/2014 |
| JP | 2014-111788 A | 6/2014 |
| JP | 2014-241201 A | 12/2014 |
| WO | WO 98/31022 A | 7/1998 |
| WO | WO 2009/032290 A1 | 3/2009 |
| WO | WO 2014/192733 A1 | 12/2014 |

OTHER PUBLICATIONS

International Preliminary Report on Patentability and Written Opinion dated Dec. 10, 2015 in PCT/JP2014/063944 (with English translation only).

Partial Supplementary European Search Report dated Jan. 5, 2017 in Patent Application No. 14804934.9.

Combined Office Action and Search Report dated Nov. 4, 2016 in Chinese Patent Application No. 201480030510.1 (with English language translation).

International Search Report dated Feb. 16, 2016 in PCT/JP2015/082305 (with English translation).

International Preliminary Report on Patentability and Written Opinion dated Jun. 8, 2017 in PCT/JP2015/082305.

International Search Report dated Feb. 23, 2017 in Japanese PCT/JP2015/082304 (with English translation ).

International Preliminary Report on Patentability and Written Opinion dated Jun. 8, 2017 in PCT/JP2015/082304.

Office Action dated Oct. 30, 2017 in co-pending U.S. Appl. No. 14/954,305, 26 pages.

"Upilex-S Technical Data Sheet", UBE Europe GmbH Performance Materials Department. 2005, pp. 1-8.

P.M. Hergenrother, et al. "Polyimides from 2,3,3',4'-biphenyltetracarboxylic dianhydride and aromatic diamines", Polymer, vol. 43, 2002, pp. 5077-5093.

Office Action dated Jul. 5, 2018 in co-pending U.S. Appl. No. 14/954,305.

Extended European Search Report dated Jul. 2, 2018 in Patent Application No. 15862218.3.

"Cables, electrical, aircraft use—Test Methods: Part 503: Scrape abrasion", British Standard Aerospace Series, EN 3475-503, 2002, 7 pages.

Office Action dated Aug. 7, 2018, in co-pending U.S. Appl. No. 15/606,433.

Furrer, D.U. Semiatin, S.L.. (2009), ASM Handbook, vol. 22A—Fundamentals of Modeling for Metals Processing—49. Density of Metals and Alloys, ASM International, Retrieved from app.knovel.comihotlinkipdf/id:kt007PH7H7/asm-handbook-volume-22a/density-metals-alloys (Year: 2009).

Combined Chinese Office Action and Search Report dated Sep. 28, 2018, in Patent Application No. 201580064185.5 (with English translation), 15 pages.

Office Action dated Nov. 2, 2018 in copending U.S. Appl. No. 14/954,305, 15 pages.

Hiroshi Inoue, et al., "Properties of Copolyimides Prepared from Different Tetracarboxylic Dianhydrides and Diamines" Journal of Applied Polymer Science, vol. 62, 1996, pp. 2303-2310.

Final Office Action dated Feb. 21, 2019 in copending U.S. Appl. No. 15/606,433 (20 pages).

Final Office Action dated May 16, 2019, in U.S. Appl. No. 14/954,305 (16 pages).

Advisory Action dated Jun. 25, 2019, in U.S. Appl. No. 15/606,433 (6 pages).

U.S. Office Action dated Nov. 29, 2019, in U.S. Appl. No. 15/606,433.

(56) References Cited

OTHER PUBLICATIONS

Japanese Office Action dated Feb. 25, 2020, in Japanese Patent Application No. 2016-561515 (with English Translation).

* cited by examiner

Cross-sectional image of a laminate obtained when an insulating coating material having an adhesion layer on one side of an insulating film is used Cross-sectional image of a laminate obtained when an insulating coating material having an adhesion layer on both sides of an insulating film is used

INSULATING COATING MATERIAL HAVING EXCELLENT WEAR RESISTANCE

CROSS-REFERENCE TO RELATED APPLICATION S

The present application is continuation of and claims the benefit of priority to International Application No. PCT/JP2015/082304, filed Nov. 17, 2015, which is based upon and claims the benefit of priority to Japanese Patent Application No. 2014-240248, filed Nov. 27, 2014, Japanese Patent Application No. 2014-240249, filed Nov. 27, 2014, and Japanese Patent Application No. 2014-240250, filed Nov. 27, 2014. The entire contents of all of the above applications are incorporated herein by reference.

BACKGROUND OF THE INVENTION

Field of the Invention

The present invention relates to an insulating coating material and its use, in particular, relates to an insulating coating material having excellent abrasion resistance used for electric wires and cables and the like for aerospace applications.

Description of Background Art

For an insulating coating material for electric wires and cables for aerospace applications, in addition to heat resistance, electrical insulation, chemical resistance and flame resistance, durability characteristics such as abrasion resistance and cut through resistance (cut resistance) are demanded.

For example, as materials for electric wires and the like for aerospace applications, multilayer polyimide-fluoropolymer insulating structures and insulated wires and cables and the like having excellent cut resistance, have been developed (for example, Patent Documents 1-5).

Patent Document 1 relates to a multilayer polyimide fluoropolymer insulating material, and is mainly intended to improve dynamic cut resistance (cut through resistance). As insulating films used in an insulating coating material, specifically, a polyimide copolymer base layer of polyimide that is derived from pyromellitic acid dianhydride and 4,4'-diaminodiphenyl ether and has a thickness of 2 mils or 1 mil, a polyimide copolymer base layer that is derived from 40 mol % of 3,3',4,4'-biphenyltetracarboxylic acid dianhydride, 60 mol % of pyromellitic acid dianhydride, 60 mol % of p-phenylenediamine, and 40 mol % of 4,4'diaminodiphenyl ether and has a thickness of 0.5 mils, and a polyimide copolymer base layer that is derived from 100 mol % of pyromellitic acid dianhydride, 60 mol % of p-phenylenediamine and 40 mol % of 4,4'diaminodiphenyl ether and has a thickness of 0.75 mils are disclosed. However, there is no specific description about abrasion resistance.

Patent Document 2 is mainly intended to improve heat seal strength, and an Apical AV is used as an insulating film that is used for an insulating coating material. However, there is no description of specific evaluation of abrasion resistance.

Patent Document 3 is intended to also improve abrasion resistance (abrasion wear). However, Patent Document 3 discloses that, when a relatively thin polyimide film having a thickness of 0.65 mils is used, the best abrasion resistance is 111 times.

Patent Document 4 discloses a wire wrapping composition that includes a polyimide layer and a bonding layer of a fluorine resin. According to Patent Document 4, although there is disclosure on a scraping (abrasion) property, the scraping property is not evaluated as a property.

Patent Document 5 discloses a polyimide film that has a specific loop stiffness value and a specific linear expansion coefficient. Patent Document 5 is intended to improve thermal dimensional stability and sliding flexibility, which are properties that are required for a polyimide film used in a flexible printed circuit board. Patent Document 5 discloses a polyimide film for a flexible printed circuit board, in which a polyimide film that is formed from 4,4'-oxydianiline and p-phenylenediamine and has an average linear expansion coefficient of $1.0\text{-}2.5\times10^{-5}$ cm/cm/° C. in a temperature range of 100-200° C. is used at a specific ratio. However, attention is focused on applications and characteristics different from those of an insulating coating material for electric wires and cables, and a structure is also different. Further, a loop stiffness value of 0.4-1.2 g/cm is a relatively low value.

Currently, as insulating coating materials that can be used, An Oasis manufactured by DuPont and an Apical (Type AF) manufactured by Kaneka North America are known.

Patent Document 1: Japanese Patent Laid-Open Publication No. Hei 10-100340 (published on Apr. 21, 1998).
Patent Document 2: U.S. Patent Application Publication No. 2010/0282488.
Patent Document 3: U.S. Pat. No. 7,022,402.
Patent Document 4: Japanese Translation of PCT International Application Publication No. 2013-512535 (published on Apr. 11, 2013).
Patent Document 5; U.S. Pat. No. 7,018,704.

SUMMARY OF THE INVENTION

According to an aspect of the present invention, an insulating coating material includes an insulating film, and an adhesion layer on at least one side of an insulating film. The insulating film satisfies Formula (1)

$$a = k \times b^3 \qquad \text{Formula (1)}$$

where a is a loop stiffness value in g/cm of the insulating film, b is a thickness in μm of the insulating film, and k is 0.000105 or more.

According to another aspect of the present invention, an insulating coating material includes an insulating film, and an adhesion layer on at least one side of an insulating film. The insulating film has a yield strength of 160 MPa or more where the yield strength is obtained from a stress-strain curve obtained by a tensile elastic modulus measurement, and the insulating film has a plastic deformation region that satisfies a relationship (1)

$$2.6 \times a + 175 < x < 6.0 \times a + 370 \qquad (1)$$

where x is a stress in MPa in the plastic deformation region, and a is a strain in % in the plastic deformation region.

According to still another aspect of the present invention, an insulating coating material includes an insulating film, and an adhesion layer on at least one side of an insulating film. An abrasion property of a laminate, which is obtained by laminating and integrating members such that the adhesion layer of the insulating coating material is in contact with a conducting wire and the laminate has a structure of insulating coating material/conducting wire/insulating coating material, is 3.0 times or more, and the insulating film has a thickness of 20 μm or less.

According to yet another aspect of the present invention, a method of evaluating an abrasion property of an insulating coating material includes producing a laminate obtained by laminating insulating films, adhesion layers and a conducting wire in the following order (a) or (b): (a) insulating film-adhesion layer-conducting wire adhesion layer-insulating film; or (b) adhesion layer-insulating film-adhesion layer-conducting wire-adhesion layer-insulating film-adhesion layer, and performing evaluation on the laminate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
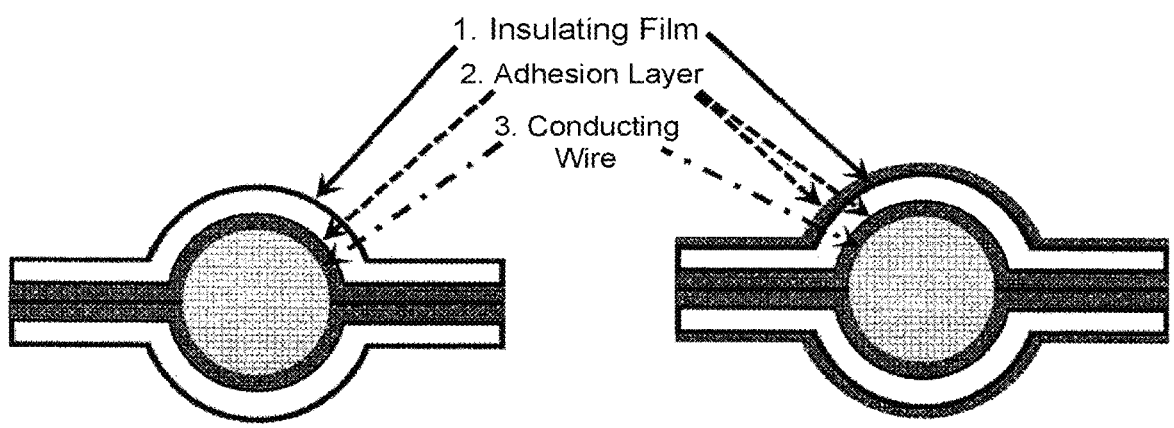
FIG. 1 illustrates a cross-sectional image of a laminate according to an embodiment of the present invention.

The embodiments will now be described with reference to the accompanying drawings, wherein like reference numerals designate corresponding or identical elements throughout the various drawings.

Examples of embodiments of the present invention are described in detail in the following. All of academic literature and patent documents described in the present specification are incorporated by reference in the present specification.

Embodiment (A)

<1. Insulating Coating Material>

An insulating coating material according to an embodiment of the present invention has an adhesion layer on at least one side of an insulating film. An abrasion property of a laminate, which is obtained by laminating and integrating members such that the adhesion layer of the insulating coating material is in contact with a conducting wire and the laminate has a structure of insulating coating material/conducting wire/insulating coating material, is 3.0 times or more, and a thickness of the insulating film is 20 µm or less.

In the following, a method for producing the laminate is described. The integrated laminate is produced by laminating members and applying heat and pressure thereto such that the laminate has, for example, a structure of metal plate/cushioning material/insulating coating material/conducting wire/insulating coating material/cushioning material/metal plate.

The metal plate to be used is not particularly limited. An SUS plate may be used, and a surface thereof is preferably subjected to a mirror surface treatment.

The cushioning material to be used is not particularly limited. A polyimide film, a cardboard or the like may be used. The cushioning material can be selected according to a heating temperature. For example, a Kinyo board (manufactured by Kinyosha Co., Ltd.) can be used. Further, these may be used in combination. The conducting wire to be used is not particularly limited as long as it is a conductor, and is often a metal. Examples of the metal include copper, aluminum, stainless steel and the like. Although copper is preferred, aluminum is also preferred from the point of view of weight reduction. Further, these metals may be various alloys, and their surfaces may be plated with various materials. Although not particularly limited, for example, high performance conductor nickel coated copper (AWG: 20, CONST: 19/32) manufactured by Phelps Dodge Corporation can be used. A diameter of the conducting wire is not particularly limited. However, since a diameter of a conducting wire that is currently mainly used in the market is about 0.9 mm, it is preferable to use a conducting wire having a diameter of 0.9 mm in order to obtain a more accurate value.

Conditions for applying heat and pressure during the production of the integrated laminate are not particularly limited. However, it is preferable that the heating temperature be in a range of 280-340° C., the pressure be in a range of 35-90 kgf/cm$^2$, and a heating time be in a range of 5-20 minutes. Although the heating temperature, the pressure and the heating and pressing time can be adjusted according to a type of an adhesion layer that is used, when lamination and integration are performed in these ranges, the adhesion layer melts and is bonded and fixed to the conductor, and a desired laminate can be obtained. When there is an adhesion layer on each of both sides of the insulating film, in order to avoid fusion of the adhesion layer and the cushioning material, it is preferable to insert a sheet formed of polytetrafluoroethylene and apply heat and pressure thereto.

<2. Evaluation Method of Abrasion Property of Laminate and Abrasion Property of Insulating Coating Material>

An abrasion property in the present invention refers to an abrasion property measured using a device and a protocol described in the British Standard Aerospace Series BS EN3475-503 using the laminate described in the section <1. Insulating Coating Material>. For example, with respect to a laminate of FIG. 1, an abrasion property of a surface of a convex portion corresponding to a place where a conducting wire is positioned is evaluated using the device and the protocol described in the British Standard Aerospace Series BS EN3475-503. Evaluation of the abrasion property is performed five times and an average value thereof is used. As a measurement device, for example, a Repeated Scrape Abrasion Tester (Cat 158L238G1), manufactured by WELLMAN Co., Ltd., can be used.

Conventionally, an abrasion resistance evaluation method adopted by aircraft manufacturers and electric wire and cable manufacturers is to conduct an abrasion resistance test by producing an insulated cable by winding an insulating coating material having a width of about 4-8 mm on a conducting wire. A tape-like long sample is required as an insulating coating material wound around a conducting wire. Further, with regard to conditions and methods for a process in which heating and pressure bonding are performed while a tape-like insulating coating material is wound on a conducting wire, criteria unique to each manufacturer are established. Therefore, for manufacturers that manufacture insulating coating materials or manufacturers that manufacture insulating films used for insulating coating materials, abrasion resistance evaluation is considerable difficulty. That is, even when manufacturers that manufacture insulating coating materials or manufactures that manufacture insulating films used for insulating coating materials attempt to perform abrasion resistance evaluation, it is necessary to first provide an adhesion layer on a long insulating film using a coating method or a lamination method, and then to obtain an insulated wire for evaluation by performing heating and pressure bonding while continuously winding the long insulating film with the adhesion layer, which has been processed into a tape-like shape, on a conducting wire using a conducting wire coating machine such as the one disclosed in Patent Document 1, and thereafter to evaluate abrasion resistance, for example, using an evaluation method such as the one described in British Standard Aerospace Series BS EN3475-503. Such evaluation requires a significant amount of time and effort in preparing an evaluation sample. Therefore, regarding how to design the insulating film and the adhesion layer that are used for the insulating coating material, an insulated wire is obtained by winding the insulating coating material on a conducting wire and abrasion resistance of the insulated wire is confirmed. When the abrasion resistance is insufficient, there is no other method than repeating the same work until an insulated wire having excellent abrasion resistance is obtained.

Therefore, while repeating trial and error, the present inventors examined characteristics that allow characteristics necessary for obtaining an insulating coating material and/or an insulating film having excellent abrasion resistance to be confirmed using a method simpler than the conventional method, and discovered that, when an abrasion property is measured using the above method, a laminate of the structure of FIG. 1 can be prepared and used in the evaluation and thus, without the need of using a complicated process, a film having excellent abrasion resistance can be appropriately and efficiently obtained. That is, the present inventors found a correlation between abrasion resistance that is actually evaluated and a result of an abrasion property when a laminate of the structure of FIG. 1 is used. Further, the present inventors prepared a large number of various films including an Apical film manufactured by Kaneka and a Kapton film manufactured by DuPont, which are already known as insulating films that are used in conventional insulating coating materials, and a film that is specifically disclosed in Patent Document 1 and has excellent dynamic cut resistance, and obtained insulating coating materials using the films, and performed various measurements of abrasion resistance of an insulated wire obtained by actually winding an insulating coating material on a wire and an abrasion property using the above-described laminate, and found that, when an insulating film or an insulating coating material is thin, in order for the abrasion resistance of an obtained insulated wire to be 200 times or more, the abrasion property obtained using the evaluation method in which the laminate of the present embodiment is used is at least 3.0 times or more.

That is, the present invention includes a method, which is a method for evaluating an abrasion property of an insulating coating material, in which the abrasion property is evaluated using a laminate obtained by laminating insulating films, adhesion layers and a conducting wire in the following order (a) or (b):

(a) insulating film-adhesion layer-conducting wire-adhesion layer-insulating film; or (b) adhesion layer-insulating film-adhesion layer-conducting wire-adhesion layer-insulating film-adhesion layer.

An evaluation method of the abrasion property is not particularly limited. However, for example, a process can be adopted in which the above-described laminate is used in an evaluation method described in the British Standard Aerospace Series BS EN3475-503. Here, the term "abrasion property evaluation" is synonymous with "abrasion property measurement", "abrasion resistance evaluation" or "abrasion resistance measurement." As a more specific process, a method described in Examples (to be described later) can be used.

Based on the above-described evaluation method, by performing abrasion property evaluation of the laminate of FIG. 1, without using a complicated and laborious process, it is possible to examine what characteristics are required to have as an insulating coating material in order to develop abrasion resistance of an insulated wire produced by winding an insulating coating material on a conducting wire, and further, without performing complicated and laborious tests such as winding a long tape-like insulating coating material on a conducting wire and performing heating and pressure bonding, and actually manufacturing an insulated cable and evaluating its abrasion resistance, an insulating coating material having excellent abrasion resistance can be extremely easily manufactured. As a result, an effect on improving efficiency of development of insulating coating materials is also large.

However, according to the British Standard Aerospace Series BS EN3475-503, abrasion resistance of 100 times as a required physical property is described. This standard is referenced as a guide for abrasion resistance by aircraft manufacturers. Abrasion resistance of each of many insulating coating materials that are currently actually used for civil aircrafts and the like also depends on a thickness of the material. For a thin material, abrasion resistance of 100 times is used as a guide and the material is designed to have abrasion resistance larger than 100 times. However, in the present embodiment, in order to provide an insulating coating material having a higher degree of abrasion resistance, acceptable abrasion resistance is 300 times or higher.

On the other hand, the abrasion resistance of an insulating coating material largely depends on characteristics of an insulating film and becomes worse as the insulating film becomes thinner. In particular, there is no known excellent insulating coating material for which an a thin insulating film having a thickness of 20 μm or less is used and which can significantly improve abrasion resistance of an insulated wire. According to the present invention, even when a thin insulating film having a thickness of 20 μm or less is used, abrasion resistance of a resulting insulated cable is improved.

For the insulating coating material of the present embodiment, a laminate is produced using a method described in the present specification and an abrasion property is 3.0 times or more. The abrasion property is preferably 3.5 times or more, more preferably 4.0 times or more, and particularly preferably 4.5 times or more. When an insulating film or an insulating coating material is selected such that an abrasion property is 3.0 times or more, even when the insulating film or the insulating coating material is thin, excellent abrasion resistance can be achieved. A value of the abrasion property is preferably as large as possible and an upper limit is not particularly set. However, for example, a value of 1000 times can be used as the upper limit.

As described above, the laminate used in the evaluation has a structure as illustrated in FIG. 1 and is completely different both in structure and in production method from a long wire obtained by winding a long tape on a conducting wire and applying heat and pressure thereto.

When an insulating coating material is designed by focusing more on properties of an insulating film, with respect to a laminate obtained by laminating and integrating members such that the laminate has a structure of insulating film/ adhesion layer/conducting wire/adhesion layer/insulating film, an insulating film may be used such that a measured abrasion property is 3.0 times or more. The adhesion layer is not particularly limited as long as the adhesion layer exhibits adhesiveness during the integration. However, from a point of view of capable of imparting an insulating property, it is preferable that a fluorine resin be used for the adhesion layer.

Whether or not an insulating film satisfying the above-described characteristics is used for the insulating coating material can be confirmed as follows.

1) An insulating film is obtained by physically removing an adhesion layer by scraping a surface of the insulating coating material.

2) The insulating film so obtained is evaluated, as described above, by obtaining a laminate by laminating and integrating members such that the laminate has a structure of insulating film/adhesion layer/conducting wire/adhesion layer/insulating film.

<3. Insulating Film>

An insulating film that can be used for the insulating coating material of the present embodiment is not particularly limited, and films formed from various insulating materials can be used. Examples of the insulating materials include polyurethane resin, poly(meth)acrylic resin, polyvinyl resin, polystyrene resin, polyethylene resin, polypropylene resin, polyimide resin, polyamide resin, polyacetal resin, polycarbonate resin, polyester resin, polyphenylene ether resin, polyphenylene sulfide resin, polyether sulfone resin, polyetheretherketone resin and the like. These materials can each be used alone, or two or more of these materials can be used in combination. Among these materials, a polyimide film using the polyimide resin is particularly preferable considering various characteristics such as heat resistance, electrical insulation, chemical resistance and flame resistance.

The polyimide film is manufactured using polyamic acid as a precursor (hereinafter, the term "polyamic acid" is used synonymously with "polyimide precursor" in this specification). A method for manufacturing the polyamic acid is not particularly limited, and any commonly known method can be used. For example, usually, the polyamic acid can be manufactured by dissolving an acid dianhydride component and a diamine component in substantially equimolar amounts in an organic solvent and stirring the mixture under a controlled temperature condition until polymerization of the acid dianhydride component and the diamine component is completed. The polyamic acid is usually obtained at a concentration of 5 wt % (percent by weight)-35 wt % and preferably 10 wt %-30 wt %. When the concentration is in this range, appropriate molecular weight and viscosity are obtained.

A polymerization method of the acid dianhydride component and the diamine component is not particularly limited, and any one of commonly known methods and any combination thereof can be used. One of characteristics of the polymerization method for the polymerization of the polyamic acid is an order of adding monomers, and various physical properties of resulting polyimide can be controlled by adjusting the order of adding the monomers.

In the present invention, a method for adding the monomers for the polymerization of the polyamic acid is not particularly limited and any method may be used. However, examples of typical polymerization methods include the following methods.

1) A method in which polymerization is performed by dissolving a diamine component in an organic polar solvent and causing it to react with a substantially equimolar amount of an acid dianhydride component.

2) A method in which an acid dianhydride component and an a diamine component in a molar amount that is excessively small relative to the acid dianhydride component are caused to react in an organic polar solvent to obtain a prepolymer having acid anhydride groups at both terminals, and subsequently, polymerization is performed using the diamine component such that the acid dianhydride component and the diamine component are present in substantially equimolar amounts in the entire process.

3) A method in which an acid dianhydride component and an a diamine component in a molar amount that is excessive relative to the acid dianhydride component are caused to react in an organic polar solvent to obtain a prepolymer having amino groups at both terminals, and subsequently, after adding more the diamine component to the prepolymer, polymerization is performed using the acid dianhydride component such that the acid dianhydride component and the diamine component are present in substantially equimolar amounts in the entire process.

4) A method in which an acid dianhydride component is dissolved and/or dispersed in an organic polar solvent and then polymerization is performed using a diamine component such that the acid dianhydride component and the diamine component are present in substantially equimolar amounts.

5) A method in which polymerization is performed by causing a mixture of substantially equimolar amounts of an acid dianhydride component and a diamine component to react in an organic polar solvent.

These methods can each be used alone, or can be used in partial combination.

In the present invention, as a preferable polymerization method for obtaining a polyimide resin, a method can be adopted that uses a method in which, first, a block component of a polyimide precursor is formed and thereafter a final polyimide precursor is formed using remaining diamine component and/or acid dianhydride component. In this case, it is preferable that the above methods 1)-5) be used in partial combination.

Example of a diamine component that can be used as a main component include 4,4'-diaminodiphenylpropane, 4,4'-diaminodiphenylmethane, 4,4'-diaminodiphenyl sulfide, 3,3'-diaminodiphenyl sulfone, 4,4'-diaminodiphenyl sulfone, 4,4'-oxydianiline, 3,3'-oxydianiline, 3,4'-oxydianiline, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene (para-phenylenediamine(p-phenylenediamine)), bis{4-(4-aminophenoxy)phenyl}sulfone, bis{4-(3-aminophenoxy)phenyl}sulfone, 4,4'-bis(4-aminophenoxy) biphenyl, 4,4'-bis(3-aminophenoxy) biphenyl, 1,3-bis(3-aminophenoxy)benzene, 1,3-bis(4-aminophenoxy)benzene, 1,4-bis(4-aminophenoxy)benzene, 1,3-bis(3-aminophenoxy)benzene, 3,3'-diaminobenzophenone, 4,4'-diaminobenzophenone, 2,2'-dimethyl-4,4'-diaminobiphenyl, 2,2-bis(4-aminophenoxyphenyl) propane, 3,3'-dihydroxy-4,4'-diamino-1,1'-biphenyl and the like. These can each be used alone or can be used in combination of two or more thereof. Further, in addition to the above diamine components, any diamine component can be used as an accessory component.

Among these, examples of a diamine component that can be particularly preferably used include 4,4'-oxydianiline, 1,3-bis(4-aminophenoxy)benzene, 3,4'-oxydianiline, 1,4-diaminobenzene (p-phenylenediamine), and 2,2-bis[4-(4-aminophenoxy)phenyl]propane.

Examples that can each be preferably used as an acid dianhydride component include pyromellitic acid dianhydride, 2,3,6,7-naphthalenetetracarboxylic acid dianhydride, 3,3',4,4'-benzophenonetetracarboxylic acid dianhydride, 2,2',3,3'-biphenyltetracarboxylic acid dianhydride, 3,3',4,4'-biphenyltetracarboxylic acid dianhydride, 2,2-bis(3,4-dicarboxyphenyl) propanoic acid dianhydride, p-phenylene bis (trimellitic acid monoester acid anhydride), 4,4'-oxydiphthalic acid dianhydride, and the like. These can each be used alone or can be used in combination of two or more thereof. In the present invention, it is preferable that one or more acid dianhydride components selected from pyromellitic acid dianhydride, 3,3',4,4'-benzophenone tetracarboxylic acid dianhydride and 3,3',4,4'-biphenyltetracarboxylic acid dianhydride be used.

A preferred solvent for synthesizing the polyamic acid is not particularly limited, and any solvent capable of dissolving the polyamic acid can be used. For example, amide-based solvents, that is, N,N-dimethylformamide (DMF), N,N-dimethylacetamide, N-methyl-2-pyrrolidone and the like, can be adopted. Among these, N,N-dimethylformamide and N,N-dimethylacetamide can be particularly preferably used.

Further, a filler can be added to the polyimide film for a purpose of improving various properties of the film such as slidability, thermal conductivity, electrical conductivity, corona resistance, loop stiffness and the like. Any filler may be used. However, preferred examples thereof include silica, titanium oxide, alumina, silicon nitride, boron nitride, calcium hydrogen phosphate, calcium phosphate, mica and the like.

A method for manufacturing the polyimide film from a polyamic acid solution is not particularly limited, and various methods can be used. For example, a thermal imidization method and a chemical imidization method can be adopted, and a film can be manufactured using any one of the methods.

Further, in the present invention, it is preferable that processes for manufacturing a particularly preferred polyimide film include:

i) a process of obtaining a polyamic acid solution by causing a diamine component and an acid dianhydride component to react in an organic solvent;

ii) a process of casting a film-forming dope containing the polyamic acid solution on a support;

iii) a process of heating the film-forming dope on the support and thereafter peeling off a gel film from the support; and iv) a process of further heating the gel film to imidize remaining amic acid and to dry the film.

In the above processes, a curing agent may be used that includes a dehydrating agent represented by an acid anhydride such as acetic anhydride, and an imidization catalyst represented by tertiary amines such as isoquinoline, quinoline, β-picoline, pyridine, diethylpyridine, and the like. Further, the dehydrating agent and the imidization catalyst can each be used alone.

In the present invention, as described above, an insulating film can be selected by preparing a test specimen in which a conducting wire is sandwiched by an insulating coating material and an abrasion property thereof is evaluated such that the abrasion property is 3.0 times or more. However, the above-described abrasion property can be adjusted to become 3.0 times or more by selecting a monomer having a structure of a biphenyl skeleton as a polymerization component, by peeling off a gel film from a support and then stretching the gel film, or by selecting appropriate conditions such as setting a higher heating temperature in a process in which a gel film is peeled off from a support and thereafter is further heated to imidize remaining amic acid and to be dried.

A person skilled in the art can perform by reasonable trial and error based on the content disclosed in this specification and the state of the art at the time of filing of this application. For reference, preferable methods for obtaining an insulating film satisfying the above characteristics are as follows.

a) As the di amine component, it is preferable to use oxydianiline (ODA). More preferably, of the entire diamine component, the ODA is used at a rate of 15 mol % or more.

b) A polyimide precursor can be formed by a process, as a first stage, in which an acid dianhydride component and a diamine component in a state in which one of the two is in an excessive molar amount are caused to react in an organic polar solvent to obtain a prepolymer having amino groups or acid dianhydride groups at both terminals, and a process, as a second stage, in which a solution containing polyamic acid is synthesized using the prepolymer obtained in the first stage, and the acid dianhydride component and the diamine component such that the prepolymer, and the acid dianhydride component and the diamine component are present in substantially equimolar amounts in the entire process. The prepolymer synthesized in the first stage may be a prepolymer having a flexible chemical structure or may be a prepolymer having a rigid chemical structure. The term "flexible chemical structure" means a structure that exhibits flexibility at high temperature and is paired with the term "rigid chemical structure." Specifically, a prepolymer derived from polyimide that exhibits flexibility at high temperature can be defined as such that a storage elastic modulus of a film of a polymer of the prepolymer measured using a dynamic viscoelasticity measuring device (DMA) reaches 50 MPa or less in a temperature range of 300-450° C.

c) Preferred examples of the acid dianhydride component used in manufacturing the prepolymer of a rigid chemical structure include pyromellitic acid dianhydride (PMDA), 3,3',4,4'-biphenyltetracarboxylic acid dianhydride (BPDA). A preferred example of the diamine component is paraphenylene diamine (PDA). It is preferable that a total amount of PMDA and BPDA is 40 mol %-90 mol % of the acid dianhydride component of the entire polyimide. It is more preferable that the prepolymer of a rigid chemical structure be formed in the second stage.

d) It is preferable that the prepolymer of a flexible chemical structure contain an ether bond. For example, of a total 100 mol % of the acid dianhydride component and the diamine component to be used, the acid dianhydride component and/or the diamine component that contain an ether bond are contained at 35-70 mol %. Further, when the prepolymer of a flexible chemical structure is synthesized, it is preferable to include 3,3',4,4'-benzophenone tetracarboxylic acid dianhydride (BTDA). For example, it is preferable that 10 mol %-55 mol % of the entire acid dianhydride component that forms the polyimide precursor be BTDA.

e) It is preferable to use BPDA as the acid dianhydride component. Of the entire acid dianhydride component, BPDA is used preferably at a ratio of 30 mol % or more, more preferably at a ratio of 50 mol % or more, even more preferably at a ratio of 70 mol % or more, and particularly preferably at a ratio of 90 mol % or more. It is also possible that BPDA is used at 100 mol %.

The above-described methods are merely examples. The methods may each be applied alone, or may be applied in combination of two or more thereof. Methods for obtaining an insulating film that satisfies the above two characteristics are not limited to the above-described methods.

Among these diamine component and acid dianhydride component, it is more preferable to include ODA and PDA as the diamine component, and PMDA, BPDA and BTDA as the acid dianhydride component.

The polymerization method is preferably a sequence polymerization method that includes steps of a first stage and a second stage. As the first stage, it is preferable that a "flexible chemical structure" segment be formed. It is preferable that at least ODA be used as a diamine component that forms the "flexible chemical structure" segment. It is preferable that at least BTDA be used as an acid dianhydride component. It is preferable that, of the acid dianhydride component of the entire polyimide, BTDA be contained at 10 mol %-30 mol %. As the second stage, it is preferable that a monomer capable of forming a "rigid chemical structure" segment be used. PDA, PMDA or BPDA can be used as a monomer capable of forming a "rigid chemical structure" segment. In particular, it is more preferable that PDA and PMDA be used as main components. It is preferable that, of the diamine component of the entire polyimide, 40 mol %-60 mol % be PDA. It is preferable that, of the acid dianhydride component of the entire polyimide, 45 mol %-85 mol % be PMDA. In order to improve alkali resistance of polyimide, it is preferable that, of the acid dianhydride component of the entire polyimide, 15 mol %-25 mol % be BPDA.

The thickness of the insulating film is not particularly limited. However, in order to realize weight reduction, for example, the thickness of the insulating film is preferably 20 μm or less, and more preferably 18 μm or less. According to the present invention, even for an insulating film that has been reduced in thickness in this way, it is possible to provide an insulating film and an insulating coating material that have excellent abrasion resistance. A lower limit of the thickness of the insulating film is not particularly limited. However, for example, the thickness of the insulating film is preferably 5 μm or more.

<4. Adhesion Layer>

An adhesion layer that can be used for the insulating coating material of the present embodiment is not particularly limited, and various adhesion layers can be used. For example, any material may be used as long as the material can bond an insulating film to a conductor of an electric wire or a conducting wire such as a cable (wire). However, it is preferable that a thermoplastic resin be used. Among thermoplastic resins, from a point of view of an insulating property, chemical resistance and the like, it is preferable that a fluorine resin be used.

As the fluorine resin, for example, a tetrafluoroethylene polymer, a tetrafluoroethylene-hexafluoropropylene copolymer (FEP), a tetrafluoroethylene-perfluoro (alkyl vinyl ether) copolymer, a tetrafluoroethylene-ethylene copolymer, polychlorotrifluoroethylene, an ethylene-chlorotrifluoroethylene copolymer, polyvinylidene fluoride, a vinylidene fluoride-hexafluoropropylene copolymer, polyvinyl fluoride and the like can each be used alone or can be used in combination of two or more thereof. Among these, it is preferable that tetrafluoroethylene polymer or tetrafluoroethylene-perfluoro (alkyl vinyl ether) copolymer be used. From a point of view of having a low melting point and allowing pressure bonding to be performed at a relatively low temperature and allowing a laminate to be easily and reliably obtained, it is more preferable that FEP be used.

An adhesion layer may be provided as a dispersion applied on an insulating film and may also be provided by using a film as an adhesion layer.

A thickness of the adhesion layer is not particularly limited as long as adhesiveness is developed. However, it is preferable that the thickness of the adhesion layer be 0.5-13 μm.

At least one adhesion layer is formed on the insulating film. That is, the insulating coating material may have a two-layer structure. Further, it is also possible that the adhesion layer is formed on both surfaces of the insulating film. That is, the insulating coating material may have a three-layer structure. Further, it is also possible that multiple adhesion layers are formed on one side of the insulating film. Further, it is also possible that one adhesion layer is formed on one side of the insulating film and multiple adhesion layers are formed on the other side of the insulating film. Further, it is also possible that multiple adhesion layers are formed on both sides of the insulating film. That is, for example, the insulating coating material according to the present embodiment can be manufactured by covering one side or both sides of an insulating film such as polyimide film that functions as a base layer with an adhesion layer containing a fluorine resin.

<5. Manufacture of Insulating Coating Material>

A method for manufacturing an insulating coating material according to the present embodiment is described. The insulating coating material according to the present embodiment has an adhesion layer on at least one side of an insulating film, and is obtained by heating and firing after laminating such an adhesion layer. The laminate of the insulating film and the adhesion layer can be manufactured by a person skilled in the art using any commonly known method. However, for example, the laminate can be usually obtained using a method in which a film-like adhesion layer is laminated on an insulating film or a method in which a resin dispersion of an adhesion layer is applied to an insulating film. For example, when the adhesion layer used in the present invention is a fluorine resin, as the dispersion, for example, a dispersion obtained by dispersing a tetrafluoroethylene-hexafluoropropylene copolymer (FEP), a tetrafluoroethylene-perfluoro (alkyl vinyl ether) copolymer (PFA), polytetrafluoroethylene (PTFE), or the like, in water or in an organic solvent can be used. Specifically, when applying the dispersion, a dispersion of the fluorine-based resin is prepared. A solid state component concentration of the dispersion used here is not particularly limited. However, a solid state component concentration of 10 wt %-70 wt % is preferable in terms of handling. Typical examples of the film in the case of laminating include films of a tetrafluoroethylene-hexafluoropropylene copolymer, polytetrafluoroethylene, a tetrafluoroethylene-perfluoro(alkyl vinyl ether) copolymer, a tetrafluoroethylene-ethylene copolymer, polychlorotrifluoroethylene containing chlorine, and the like. In the case of dispersion, the dispersion can be applied several times until a thickness of the fluorine resin used for the laminate of the polyimide and the fluorine resin according to the present embodiment reaches an appropriate thickness.

An inorganic or organic filler or the like may be added to the dispersion or the film using a commonly known method. Further, a surface of the fluorine resin or a bonding surface of the fluorine resin to the polyimide film may be subjected to a commonly known surface treatment such as a corona discharge treatment or a plasma discharge treatment.

The insulating coating material thus obtained is wound on a conducting wire, and the resulting wire is used as an insulated wire (insulated cable).

<6. Use of Insulating Coating Material>

The present invention can include an insulated cable (wire) with the above insulating coating material. Such an insulated cable, for example, can be suitably used for a conducting wire such as an electric wire or a cable (wire) for aerospace applications such as aircrafts and the like.

The conducting wire such as an electric wire or a cable (wire) can use any material as long as the material is a conductor. However, a metal is usually used. Examples of the metal include copper, aluminum, stainless steel and the like. Although copper is preferred, aluminum is also preferred from the point of view of weight reduction. Further, these metals may be various alloys, and their surfaces may be plated with various materials.

A method for manufacturing the insulated cable is not particularly limited, and various methods can be used. As an example, the insulated cable can be manufactured by forming the insulating coating material into a tape (long object) and spirally winding such a tape of the insulating coating material around a conductor (such as a metal). Further, it is also possible that, after the tape of the insulating coating material is wound around the conductor once, a tape of another insulating coating material is further wound around the conductor in an overlapping manner.

When a tape of the insulating coating material is wound around a conductor, a tensional force applied to the tape can be widely varied from a tensional force enough to avoid occurrence of wrinkling to a range of a tensional force strong enough to pull the tape to cause neck down to occur. Even when the tensional force is small, due to an influence of heat (for example, heating to 240° C.-500° C.) in a heat sealing process that is performed after the winding, the tape shrinks and thus, the conductor is covered with good adhesion by the insulating coating material. The heat sealing process can be appropriately set according to the thickness of the insulating film, the thickness of the adhesion layer, the material of the conductor, a speed of a production line, a length of a seal oven, and the like. Further, the winding of the insulating coating material on the conductor can also be performed using a standard electric wire coating machine (wrapping machine) or the like.

Embodiment (B)

In Embodiment (B), only portions that are different from Embodiment (A) are described, and for other portions, Embodiment (A) is incorporated.

<1. Insulating Coating Material>

An insulating coating material according to the present embodiment includes an insulating film and an adhesion layer. Of the insulating film, yield strength obtained from a stress-strain curve, which is obtained by tensile elastic modulus measurement, is 160 MPa or more and a stress (x) (MPa) and a strain (a) (%) in a plastic deformation region satisfy the following Formula (1).

$$2.6 \times a + 175 < x < 6.0 \times a + 370 \quad (1)$$

The present inventors found that, conventionally, in order to evaluate abrasion resistance of an insulating coating material, it is necessary to prepare a long insulating coating material that includes an insulating film and an adhesion layer and has a width of about 6 mm and to prepare an insulated wire by winding the insulating coating material around a conducting wire; evaluation of the insulated wire is itself very complicated, and it is difficult for an evaluation result of the insulated wire to be reflected in a design of an insulating film or in an insulating coating material using the insulating film; when an abrasion property is evaluated using a laminate, which is obtained by integrating members by laminating the members and applying heat and pressure thereto such that the laminate has a structure of insulating coating material/conducting wire/insulating coating material, for a larger value of the abrasion property, an insulating coating material having a more excellent abrasion resistance can be provided. Further, the present inventors found that, when an insulating coating material is designed by focusing on properties of an insulating film, with respect to a laminate, which is obtained by integrating members by laminating the members and applying heat and pressure thereto such that the laminate has a structure of insulating film/adhesion layer/conducting wire/adhesion layer/insulating film, when an abrasion property is evaluated, and when an insulating film is used such that the value of the abrasion property is increased, the insulating coating material has excellent abrasion resistance. Conditions for producing the laminate for the abrasion property evaluation are not particularly limited. However, the heating temperature may be in a range of 280-340° C., the pressure may be in a range of 35-90 kgf/cm$_2$, and the heating time may be in a range of 5-20 minutes.

As the conducting wire used in the abrasion property evaluation, for example, high performance conductor nickel coated copper (AWG: 20, CONST: 19/32, diameter: 0.9 mm) manufactured by Phelps Dodge Corporation can be used.

For details about the abrasion property, the section <2. Abrasion Property of Laminate> of Embodiment (A) is incorporated.

The adhesion layer that is used in the case where the insulating coating material is designed by focusing on the properties of the insulating film is not particularly limited as long as the adhesion layer exhibits adhesiveness during the integration. However, from a point of view of capable of imparting an insulating property, it is preferable that a fluorine resin be used for the adhesion layer. Here, among polytetrafluoroethylene (PTFE), tetrafluoroethylene-perfluoroalkyl vinyl ether copolymer (PFA), and tetrafluoroethylene-hexafluoropropylene copolymer (FEP), which are known as substitute fluoropolymers, from a point of view of having a low melting point and thus allowing pressure bonding to be performed at a relatively low temperature and allowing the laminate to be easily and reliably obtained, it is more preferable that FEP be used as the adhesion layer. The adhesion layer may be provided by applying a dispersion or may be provided by using a film. In the case of using a film, a thickness of the film is not particularly limited. However, from a point of view of transportability during processing, it is particularly preferable that a film having a thickness of 12 μm be used.

Further, the abrasion property can be evaluated according to a device and a protocol described in the British Standard Aerospace Series BS EN3475-503. For the adhesion layer used for the abrasion property evaluation, for example, a FEP film having a thickness of 12 μm can be used.

The present inventors examined improvement for the abrasion property at 23° C. with respect to various insulating films, and found that, when the abrasion property exceeds 2.0 times, the abrasion resistance can reach about 200 times; when the abrasion property exceeds 3.0 times, the abrasion resistance can reach about 300 times; when the abrasion property exceeds 4.0 times, the abrasion resistance can reach about 400 times; and when the abrasion property exceeds 5.0 times, the abrasion resistance can reach about 500 times. In the present embodiment, the abrasion property is preferably 2.0 times or more, more preferably 3.0 times or more, even more preferably 4.0 times or more, and particularly preferably 5.0 or more.

However, according to the British Standard Aerospace Series BS EN3475-503, abrasion resistance of 100 times as a required physical property is described. The British Standard Aerospace Series BS EN3475-503 is a standard that is referenced as a guide for abrasion resistance by aircraft manufacturers. Abrasion resistance of each of many insulating coating materials that are currently actually used for civil aircrafts and the like also depends on a thickness of the material. For a thin material, an abrasion resistance of 100 times is used as a guide and the material is designed to have an abrasion resistance larger than 100 times. Therefore, even when the abrasion property increases by only 0.5 times, a significant effect can be obtained in the abrasion resistance. In the present embodiment, since higher abrasion resistance is desired, a material having an abrasion property of 2.0 times or more (abrasion resistance of about 200 times or more) is preferable.

According to the present invention, even when a thin insulating film having a thickness of 20 μm or less is used, abrasion resistance of a resulting insulated wire is improved.

Based on this finding, the present inventors further advanced the study and examined what kind of an insulating film is to be used in order to provide an insulating coating material having excellent abrasion resistance, that is, an insulating coating material having a good abrasion property. As a result, the present inventors found that a film having an excellent abrasion property leads to an insulating coating material in which an insulating film, which has a high yield strength in a stress-strain curve obtained by tensile elastic modulus measurement and in which a stress increases even in a plastic deformation region, has an excellent abrasion property. In the following, an insulating film used for the insulating coating material of the present embodiment is described in detail.

<2. Insulating Film>

For the insulating film used for the insulating coating material according to the present embodiment, the yield strength obtained from a stress-strain curve, which is obtained by tensile elastic modulus measurement, is 160 MPa or more and a stress (x) (MPa) and a strain (a) (%) in a plastic deformation region satisfy the following Formula (1).

$$2.6 \times a + 175 < x < 6.0 \times a + 370 \tag{1}$$

For a profile of a stress-strain curve of a film that imparts excellent abrasion property to an insulating coating material, in a strain mode, that is, in a tension mode, the rise in the stress is steep from the beginning of pulling the film, and the yield strength is also large, and further, the stress increases even after passing a yield point and entering a plastic deformation region. In contrast, in the case of a film having an insufficient abrasion property, there is a tendency that the rise in the stress is gradual and the yield strength is small, and further, the increase in the stress in the plastic deformation region is small. Therefore, the present inventors found that an insulating film, of which an absolute value of yield strength obtained using a stress-strain curve is large and a stress increases in a plastic deformation region, imparts excellent abrasion property to an insulating coating material. The stress-strain curve can be obtained by performing tensile elastic modulus measurement according to ASTM D882.

The yield strength can be considered as a stress at an inflection point that first appears in the stress-strain curve. However, in the present invention, the yield strength is obtained as follows. First, a slope of a tangent at a strain of 1% is obtained. Next, sequentially, for every 0.5% increase in strain, a slope of a tangent at that strain (such as a slope of a tangent at a strain of 1.5%, and a slope of a tangent at a strain of 2%) is obtained. Then, a stress at a point where slope reaches 14 MPa/% is read. The slope of 14 MPa/% is obtained from a stress curve where an inflection point appears most clearly in an experimental example. By using this, yield points of other curves can also be roughly expressed. The yield strength in the present invention is 160 MPa or more. This is obtained as yield strength that is considered necessary to impart an excellent abrasion property to an insulating coating material, which does not include a conventionally commercially available insulating film for an insulating coating material or an insulating film disclosed in the prior art in the technical field of insulating coating materials. Higher yield strength is preferable. The yield strength is more preferably 175 MPa or more, further preferably 200 MPa or more, and particularly preferably 230 MPa or more.

Next, when the stress has increased to some extent even after entering the plastic deformation region, the stress (x) (MPa) in the plastic deformation region can be expressed using a relational formula with the strain (a) (%), and satisfies the following Relational Formula (1).

$$2.6 \times a + 175 < x < 6.0 \times a + 370 \tag{1}$$

After passing the yield point, it changes to a region where plastic deformation occurs. In the present invention, the plastic deformation region is defined as follows. In the stress-strain curve, the slope of the tangent at the strain of 1% is obtained. Next, sequentially, a slope of a tangent is obtained for every 1% increase in strain. In this way, the slopes are obtained and a point where a difference between the slope at the strain of n % and the slope at the strain of (n+1)% reaches 1 MPa/% or less is obtained. In this case, a region from the point of the strain of n % to a point where breaking occurs is defined as the plastic deformation region, and whether or not the stress (x) in this region satisfies Formula (1) is determined. In this way, the insulating film used in the present invention exhibits a behavior that the stress (x) increases in the plastic deformation region. However, even when the stress (x) decreases slightly just before breaking and falls outside the range specified by Formula (1), the effect of the present invention is considered to be still present. Therefore, the slight decrease in the strain (x) just before breaking may be ignored.

The stress (x) in the plastic deformation region of the insulating film of the present embodiment exceeds 2.6×a+ 175 (where "x" represents the stress (MPa) and "a" represents the strain (%)). The stress (x) in the plastic deformation region increases with a slope of at least 2.6 MPa/% with respect to the strain, and needs to be in a range larger than the above linear function with an intercept of 175. It is not preferable for the stress (x) to be below this range, because the abrasion property would deteriorate.

Further, in view of the technical idea of the present invention, it is preferable that the stress (x) of the insulating film of the present embodiment be as large as possible. However, from a point of view of handleability when the insulating coating material is wound around a conducting wire, it is preferable that the stress (x) increases with a slope of 6.0 MPa/% and be in a range smaller than a linear function with an intercept of 370.

It is more preferable that the stress (x) satisfy the following Formula (2), further preferable that the stress (x) satisfy the following Formula (3), and particularly preferable that the stress (x) satisfy the following Formula (4).

$$2.7 \times a + 195 < x < 6.0 \times a + 370 \quad (2)$$

$$2.8 \times a + 215 < x < 6.0 \times a + 370 \quad (3)$$

$$3.7 \times a + 260 < x < 6.0 \times a + 370 \quad (4)$$

In Formulas (2)-(4), "x" represents the stress (MPa), and "a" represents the strain (%).

An insulating film that can be used for the insulating coating material of the present embodiment is not particularly limited, and films formed from various insulating materials can be used.

From a point of view of durability characteristics and other required characteristics, hydrolysis resistance may be required together with the abrasion resistance for the insulating film. The hydrolysis resistance, for example, can be evaluated using tear strength retention rates before and after a PCT test (pressure cooker test). Tear strength can be evaluated before and after a PCT test according to ASTM D-1938. For example, a PCT test was conducted for 96 hours under conditions of 150° C., 100% RH, 0.4 MPa. A value obtained by dividing tearing strength after a PCT test by tearing strength before the PCT test can be used as a tear strength PCT retention rate.

As a method that increases the yield strength and allows the stress to be increased even after entering the plastic deformation region, there is a method that increases rigid chemical structures. Specifically, there is a method in which 2,2',3,3'-biphenyl-tetracarboxylic acid dianhydride or 3,3',4,4'-biphenyl-tetracarboxylic acid dianhydride is used as an acid dianhydride component. There is a tendency that as an amount of these acid dianhydrides used increases, the yield strength increases, and the stress increases even after entering the plastic deformation region.

There is also a method of using one of the methods 2) and 3), which are described as examples of representative polymerization methods above in Embodiment (A). When this method is used, by appropriately selecting monomers to be used in a stage of preparing a prepolymer, a unit having a flexible structure or a unit having a rigid structure can be selectively introduced with a desired unit length, and thus, it is suitable for adjusting a stiffness value.

In the present invention, as described above, an insulating film can be selected by preparing a test specimen in which a conducting wire is sandwiched by an insulating coating material and an abrasion property thereof is evaluated such that the abrasion property is 2.0 times or more. However, the above-described abrasion property can be adjusted to become 2.0 times or more by selecting a monomer having a structure of a biphenyl skeleton as a polymerization component, by peeling off a gel film from a support and then stretching the gel film, or by selecting appropriate conditions such as setting a higher heating temperature in a process in which a gel film is peeled off from a support and thereafter is further heated to imidize remaining amic acid and to be dried.

A person skilled in the art can perform by reasonable trial and error based on the content disclosed in this specification and the state of the art at the time of filing of this application. In addition to the methods a)-d) described in Embodiment (A), examples of preferred methods for obtaining an insulating film satisfying the above characteristics include the following method.

e) It is preferable to use BPDA as the acid dianhydride component. Of the entire acid dianhydride component, BPDA is used preferably at a ratio of 10 mol % or more, more preferably at a ratio of 20 mol % or more, even more preferably at a ratio of 30 mol % or more, further preferably at a ratio of 50 mol % or more, particularly preferably at a ratio of 70 mol % or more, and most preferably at a ratio of 90 mol % or more. It is also possible that BPDA is used at 100 mol %.

Further, regarding the polymerization method (sequence polymerization), in addition to being able to use Embodiment (A), the following methods can also be adopted.

In a second stage, it is preferable that, of the diamine component of the entire polyimide, 40 mol %-60 mol % be PDA, and it is preferable that, of the acid dianhydride component of the entire polyimide, 45 mol %-65 mol % be PMDA.

The thickness of the insulating film is not particularly limited. However, in order to realize weight reduction, for example, the thickness of the insulating film is preferably 25 µm or less, more preferably 20 µm or less, and particularly preferably 18 µm or less. According to the present invention, even for an insulating film that has been reduced in thickness in this way, it is possible to provide an insulating film and an insulating coating material that have excellent abrasion resistance. A lower limit of the thickness of the insulating film is not particularly limited. However, for example, the thickness of the insulating film is preferably 5 µm or more.

Further, there is also a method in which a gel film, which is in a state of containing a solvent while having a self-supporting property, is stretched. There is a tendency that as an amount of the stretching increases, the yield strength increases, and the stress increases even after entering the plastic deformation region.

<3. Adhesion Layer>

Regarding this item, Embodiment (A) is incorporated.

<4. Manufacture of Insulating Coating Material>

A method for manufacturing an insulating coating material according to the present embodiment is described. The insulating coating material according to the present embodiment is obtained by laminating an adhesion layer on both sides or one side of an insulating film and by heating and firing after laminating such an adhesion layer.

In the case of dispersion, the dispersion can be applied several times until a thickness of the fluorine resin used for the laminate of the polyimide and the fluorine resin according to the present invention reaches an appropriate thickness. Further, in the case of laminating as a film, a film thickness of the film of the fluorine resin is preferably 7.5-25 µm.

<5. Use of Insulating Coating Material>

Regarding this item, Embodiment (A) is incorporated.

Embodiment (C)

In Embodiment (C), only portions that are different from Embodiments (A) and (B) are described, and for other portions, Embodiments (A) and (B) are incorporated.

<1. Insulating Coating Material>

An insulating coating material according to the present embodiment has an adhesion layer on at least one side of an insulating film. In the following Formula (1) for a loop stiffness value (a) (g/cm) of the insulating film and a thickness (b) (µm) of the insulating film, k is 0.000105 or more.

$$a = k \times b^3 \quad \text{Formula (1)}$$

The loop stiffness value (a) (g/cm) is a value actually measured using a loop stiffness tester and, for example, can be measured using a loop stiffness tester manufactured by Toyo Seiki Seisaku-sho Ltd. The loop stiffness value (a) (g/cm) is a value obtained by reading a force when two minutes have elapsed after squashing under conditions that a sample width is 10 mm, a loop length is 50 mm, and a distance between squashings is 10 mm for the measurement.

The thickness (µm) of the insulating film can be measured using a contact thickness gauge.

The present inventors found that, conventionally, in order to evaluate abrasion resistance of an insulating coating material, it is necessary to prepare a long insulating coating material that includes an insulating film and an adhesion layer and has a width of about 6 mm and to prepare an insulated wire by winding the insulating coating material around a conducting wire; evaluation of the insulated wire is itself very complicated, and it is difficult for an evaluation result of the insulated wire to be reflected in a design of an insulating film or in an insulating coating material using the insulating film; when an abrasion property is evaluated using a laminate, which is obtained by integrating members by laminating the members and applying heat and pressure thereto such that the laminate has a structure of insulating coating material/conducting wire/insulating coating material, for a larger value of the abrasion property, an insulating coating material having a more excellent abrasion resistance can be provided. Further, the present inventors found that, when an insulating coating material is designed by focusing on properties of an insulating film, with respect to a laminate, which is obtained by integrating members by laminating the members and applying heat and pressure thereto such that the laminate has a structure of insulating film/adhesion layer/conducting wire/adhesion layer/insulating film, when an abrasion property is evaluated, and when an insulating film is used such that the value of the abrasion property is increased, the insulating coating material has excellent abrasion resistance. Conditions for producing the laminate for the abrasion property evaluation are not particularly limited. However, the heating temperature may be in a range of 280-340° C., the pressure may be in a range of 35-90 kgf/cm², and the heating time may be in a range of 5-20 minutes. Further, the abrasion property is evaluated according to a device and a protocol described in the British Standard Aerospace Series BS EN3475-503.

For details about the abrasion property, the section of <2. Abrasion Property of Laminate> of Embodiment (A) is incorporated.

Based on this finding, the present inventors further advanced the study and, in order to provide an insulating coating material having excellent abrasion resistance, that is, an insulating coating material having a good abrasion property, examined what kind of an insulating film can improve the abrasion resistance by focusing on characteristics of the insulating film. As a result, the present inventors found that an insulating film having excellent abrasion resistance leads to an insulating coating material in which an insulating film of which a loop stiffness value and a thickness satisfy Formula (1) has an excellent abrasion property.

However, Patent Document 4 suggests that a loop stiffness value is proportional to an elastic modulus of a film and is proportional to the cube of a thickness of the film. However, this indicates only a certain kind of tendency. Even in Patent Document 4, it is clear from the description and the examples that the loop stiffness value means only a measured value. The loop stiffness value used in the present invention refers to a measured value that is measured using a loop stiffness tester. In fact, the elastic modulus is one of film properties that are frequently measured by a person skilled in the art in the technical field as described in Patent Document 4. However, in the process of studying an insulating coating material having excellent abrasion resistance, the present inventors found that the elastic modulus does not provide guidance for the design of the insulating film that leads to an insulating coating material having excellent abrasion resistance. That is, an insulating film having a high elastic modulus does not necessarily lead to an insulating coating material having excellent abrasion resistance.

However, the present inventors prepared insulating films that exhibit different loop stiffness values by focusing on loop stiffness values that are not often measured in the field of insulating films used for insulating coating materials for covering electric wires and cables and by intensively examining types and composition ratios of monomers used as raw materials for the insulating films and manufacturing conditions and the like for film formation, stretching and the like. By evaluating abrasion resistance of these insulating coating materials using an abrasion property that is a controlling characteristic for improving the abrasion resistance, the present inventors found that an insulating film having a specific loop stiffness value is an insulating film that leads to an insulating coating material having excellent abrasion resistance, and thus accomplished the present invention.

When the loop stiffness value and the thickness of the insulating film described in the examples of Patent Document 4 are used to obtain k from Formula (1), the result is in a range of 0.0000755-0.00008638. Further, as insulating films used for insulating coating materials for covering electric wires and cables, a polyimide film Kapton manufactured by DuPont and an Apical manufactured by Kaneka North America are known. These films and films described in the example of Patent Document 8 were prepared and their loop stiffness values (a) and thicknesses (b) were measured, and k was obtained from Formula (1). As a result, k is less than 0.000105.

Thus, the insulating coating material of the present embodiment is a film different from those conventional insulating films that have been used, and is a novel insulating coating material using the insulating film.

The insulating film used for the insulating coating material of the present embodiment solves the problem by having k being 0.000105 or more in Formula (1). However, it is more preferable that k be 0.000113 or more, and even more preferable that k be 0.000120.

In view of the technical idea of the present invention, it is preferable that the loop stiffness value be as high as possible. However, from a point of view of suppressing spring back when the insulating coating material is wound around a conducting wire, it is more preferable that the loop stiffness value be 2.4 g/cm or less, and even more preferable that the loop stiffness value be 1.6 g/cm or less, and particularly preferable that the loop stiffness value be 1.0 g/cm or less.

For example, for insulated cables that are used for aircrafts, weight reduction is strongly demanded. Simply increasing the thickness of the insulating film improves the abrasion resistance, but leads to an increase in weight. That is, it is demanded to improve the abrasion resistance without increasing the thickness of the insulating film as much as possible. The insulating coating material according to the present embodiment has an excellent abrasion resistance as compared to a conventional insulating coating material not only when the film is thick but also when the film is thin. The thickness of the insulating film is not particularly limited. However, in order to realize weight reduction, for example, the thickness of the insulating film is preferably 25 μm or less, more preferably 20 μm or less, even more preferably 18 μm or less, and particularly preferably 17 μm or less. According to the present invention, even for an insulating film that has been reduced in thickness in this way, it is possible to provide an insulating film and an insulating coating material that have excellent abrasion resistance. A lower limit of the thickness of the insulating film is not particularly limited. However, for example, the thickness of the insulating film is preferably 5 μm or more.

By preparing an insulating coating material by combining an insulating film having such characteristics with an adhesion layer (to be described later), preferably an adhesion layer containing a fluorine resin, abrasion resistance of an insulated wire obtained by winding the insulating coating material on a conducting wire or the like is significantly improved.

In the following, the insulating film and an adhesive film are further described in detail.

<2. Insulating Film>

An insulating coating material according to the present embodiment includes an insulating film and an adhesion layer. In the following Formula (1) for a loop stiffness value (a) (g/cm) of the insulating film and a thickness (b) (μm) of the insulating film, k is 0.000105 or more.

$$a = k \times b^3 \quad \text{Formula (1)}$$

(In Formula (1), "a" represents the loop stiffness value (g/cm), and "b" represents the thickness (μm) of the insulating film).

In the present invention, a method for adding monomers for polymerization of the polyamic acid is not particularly limited, and any method may be used. However, for example, the method described in the above in Embodiment (A) can be preferably used. As a method that allows the loop stiffness value to be easily controlled, there is a method in which 2,2',3,3'-biphenyltetracarboxylic acid dianhydride or 3,3',4,4'-biphenyltetracarboxylic acid dianhydride is used as an acid dianhydride component. As an amount of these acid dianhydrides used increases, the loop stiffness value increases.

As described above, the loop stiffness value can be easily measured. Therefore, it is possible to select the monomer and the polymerization method such that a desired loop stiffness value is obtained. There is a tendency that the loop stiffness value increases as the number of rigid chemical structures increases and decreases as the number of flexible chemical structures increases. Therefore, the adjustment of the loop stiffness value can be performed by adjusting a ratio of a component having a rigid structure to a component having a flexible structure in the acid dianhydride component and the diamine component. Among these polymerization methods, a method combined with the method 3) or 4) allows a unit having a flexible structure or a unit having a rigid structure to be selectively introduced with a desired unit length and thus is suitable for adjusting the loop stiffness value.

A person skilled in the art can perform by reasonable trial and error based on the content disclosed in this specification and the state of the art at the time of filing of this application. For examples of preferred methods for obtaining an insulating film satisfying the above characteristics, the methods a)-d) of Embodiment (A) and the method e) of Embodiment (B) are incorporated.

Further, regarding the polymerization method (sequence polymerization), Embodiments (A) and (B) are incorporated.

From a point of view of durability characteristics and other required characteristics, hydrolysis resistance may be required together with the abrasion resistance for the insulating film. The hydrolysis resistance according to the present embodiment was evaluated using tear strength retention rates before and after a PCT test (pressure cooker test). The tear strength was measured before and after a PCT test according to ASTM D-1938. The PCT test was conducted for 96 hours under conditions of 150° C., 100% RH, 0.4 MPa. A value obtained by dividing the tearing strength after the PCT test by the tearing strength before the PCT test was used as a tear strength PCT retention rate. For reference, a preferred method for obtaining an insulating film satisfying the tear strength PCT retention rate is the same as the method suitable for adjusting the loop stiffness value.

Further, a filler can be added to the polyimide film for a purpose of improving various properties of the film such as slidability, thermal conductivity, electrical conductivity, corona resistance, a loop stiffness value and the like.

Further, in the present invention, it is preferable that processes for manufacturing a particularly preferred polyimide film include:

i) a process of causing aromatic diamine and aromatic tetracarboxylic acid dianhydride to react in an organic solvent to obtain a polyamic acid solution;

ii) a process of casting a film-forming dope containing the polyamic acid solution on a support;

iii) a process of heating the film-forming dope on the support and thereafter peeling off a gel film from the support; and iv) a process of further heating the gel film to imidize remaining amic acid and to dry the film.

The loop stiffness value can be adjusted by adjusting a tensional force acting on the gel film after peeling off the gel film in the process iii). There is a tendency that the loop stiffness value increases when the tensional force acting on the gel film increases.

In the above processes, a curing agent may be used that includes a dehydrating agent represented by an acid anhydride such as acetic anhydride, and an imidization catalyst represented by tertiary amines such as isoquinoline, quinoline, pyridine, diethylpyridine, and the like. Further, the dehydrating agent and the imidization catalyst can each be used alone.

The loop stiffness value is set to a desired range by using these methods independently or in combination.

The loop stiffness value of an insulating film can be easily measured, and an insulating coating material can be obtained by providing an adhesion layer (to be described later) on at least one side of the insulating film that satisfies that k=0.000105 or more in Formula (1). When a loop stiffness value of an insulating film from an insulating coating material is measured, an insulating film is obtained by physically removing the adhesion layer, such as scraping a surface of the insulating coating material, and a loop stiffness value of the insulating film is measured.

<3. Adhesion Layer>

Regarding this item, Embodiment (A) is incorporated.

<4. Manufacture of Insulating Coating Material>

A method for manufacturing an insulating coating material according to the present embodiment is described. The insulating coating material according to the present embodiment is obtained by laminating an adhesion layer on both sides or one side of an insulating film and by heating and firing after laminating such an adhesion layer.
<5. Use of Insulating Coating Material>
Regarding this item, Embodiment (A) is incorporated.
<Miscellaneous>
A form in which the above-described Embodiments (A)-(C) are appropriately combined is also an example of an embodiment of the present invention. Examples of forms in which Embodiments (A)-(C) are combined include, specifically, the following combinations.

(1) A form in which Embodiment (A) and Embodiment (B) are combined.
(2) A form in which Embodiment (A) and Embodiment (C) are combined.
(3) A form in which Embodiment (B) and Embodiment (C) are combined.
(4) A form in which Embodiment (A), Embodiment (B) and Embodiment (C) are combined.

The above embodiments (1)-(4), for example, respectively have the following structures described in the following <Structures of the Present Invention>.

(1) Combination of the following Structure 5 and Structure 3.
(2) Combination of the following Structure 5 and Structure 1.
(3) Combination of the following Structure 3 and Structure 1.
(4) Combination of the following Structure 5, Structure 3 and Structure 1.

<Structures of the Present Invention>
The present invention has the following structures.

1. An insulating coating material has an adhesion layer on at least one side of an insulating film. For the insulating film, in the following Formula (1) for a loop stiffness value (a) (g/cm) of the insulating film and a thickness (b) (μm) of the insulating film, k is 0.000105 or more.

$$a = k \times b^3 \quad \text{Formula (1)}$$

2. In the insulating coating material described in the above structure 1, the loop stiffness value (a) of the insulating film is 2.4 g/cm or less.

3. An insulating coating material has an adhesion layer on at least one side of an insulating film. Of the insulating film, yield strength obtained from a stress-strain curve, which is obtained by tensile elastic modulus measurement, is 160 MPa or more and a stress (x) (MPa) and a strain (a) (%) in a plastic deformation region satisfy the following Formula (1).

$$2.6 \times a + 175 < x < 6.0 \times a + 370 \quad (1)$$

4. In the insulating coating material described in the above structure 3, an abrasion property is 2.0 times or more.

5. An insulating coating material has an adhesion layer on at least one side of an insulating film. An abrasion property of a laminate, which is obtained by laminating and integrating members such that the adhesion layer of the insulating coating material is in contact with a conducting wire and the laminate has a structure of insulating coating material/conducting wire/insulating coating material, is 3.0 times or more, and a thickness of the insulating film is 20 μm or less.

6. In the insulating coating material described in any one of the above structures 1-4, the thickness of the insulating film is 25 μm or less.

7. In the insulating coating material described in any one of the above structures 1-6, the insulating film is a polyimide film.

8. In the insulating coating material described in any one of the above structures 1-7, the adhesion layer contains a fluorine resin.

9. An insulated cable or an insulated wire obtained by winding the insulating coating material according to any one of the above structures 1-8 around a conducting wire.

10. A method for evaluating an abrasion property of an insulating coating material, in which measurement is performed using a laminate obtained by laminating insulating films, adhesion layers and a conducting wire in the following order (a) or (b):
(a) insulating film-adhesion layer-conducting wire-adhesion layer-insulating film; or
(b) adhesion layer-insulating film-adhesion layer-conducting wire-adhesion layer-insulating film-adhesion layer.

EXAMPLES

In the following, based on Examples and Comparative Examples, the present invention is further specifically described. The present invention is not limited to the following Examples.

Examples (A)

Synthesis Example (1A): Synthesis of Polyimide Precursor (1A)

974.9 kg of DMF was charged into a kettle having a capacity of 1900 L; 45.1 kg of 4,4'-oxydianiline (ODA) was added; 29.2 kg of 3,3',4,4'-biphenyltetracarboxylic acid dianhydride (BPDA) was added, 33.4 kg of 3,3',4,4'-benzophenonetetracarboxylic acid dianhydride (BTDA) was added; and the mixture was stirred for 50 minutes to dissolve. Here, 24.4 kg of para-phenylenediamine (PDA) was added; 51.1 kg of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2500 poise, and thus a polyimide precursor (1A) was obtained.

Synthesis Example (2A): Synthesis of Polyimide Precursor (2A)

976.5 kg of DMF was charged into a kettle having a capacity of 1900 L; 31.9 kg of 2,2-bis-[4-(4-aminophenoxy)phenyl]propane (BAPP) was added; 27.7 kg of 4,4'-oxydianiline (ODA) was added; 27.8 kg of 3,3',4,4'-benzophenonetetracarboxylic acid dianhydride (BTDA) was added; 23.5 kg of pyromellitic acid dianhydride (PMDA) was added; and the mixture was stirred for 50 minutes to dissolve. Here, 23.3 kg of para-phenylenediamine (PDA) was added; 49.0 kg of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2500 poise, and thus a polyimide precursor (2A) was obtained.

Synthesis Example (3A): Synthesis of Polyimide Precursor (3A)

A polyimide precursor was prepared using 40 mol % of 3,3',4,4'-biphenyltetracarboxylic acid dianhydride, 60 mol % of pyromellitic acid dianhydride, 60 mol % para-phenylenediamine and 40 mol % of 4,4'diaminodiphenyl ether described in Example (1A) of Patent Document 1. That is, 993.6 kg of DMF was charged into a kettle having a capacity of 1900 L; 55.6 kg of 3,3',4,4'-biphenyltetracarboxylic acid dianhydride (BPDA) was added; 61.9 kg of pyromellitic acid dianhydride (PMDA) was added; 37.9 kg of 4,4'-oxydianiline (ODA) was added; 29.1 kg of para-phenylenediamine (PDA) was added; and the mixture was stirred for 1 hour to dissolve. A separately prepared DMF solution (7 wt %) of PDA was gradually added to the above reaction solution until viscosity at 23° C. reached 2500 poise, and thus a polyimide precursor (3A) was obtained.

Synthesis Example 4: Synthesis of Polyimide Precursor (4A)

975.35 kg of DMF was charged into a kettle having a capacity of 1600 L; 89.0 kg of 4,4'-oxydianiline (ODA) was added; 94.1 kg of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2500 poise, and thus a polyimide precursor (4A) was obtained.

Example (1A)

<Preparation of Laminate of the Present Invention>
The polyimide precursor (1A) (110 g) obtained in Synthesis Example (1A) contained the following chemical dehydrating agent and catalyst and DMF.
Chemical dehydrating agent: 2.0 mol of acetic anhydride per 1 mol of an amic acid unit of the polyamic acid of the polyimide precursor
Catalyst: 0.8 mol of isoquinoline per 1 mol of an amic acid unit of the polyamic acid of the polyimide precursor
DMF: In a weight such that a total weight of the chemical dehydrating agent and the catalyst and the DMF is 50% of a weight of the polyimide precursor
The mixture was stirred and defoamed at a temperature of 0° C. or less, and was applied by casting on an aluminum foil using a comma coater. This resin film was heated at 118° C. for 110 seconds. Thereafter a self-supporting gel film was peeled off from the aluminum foil and was fixed to a metal frame, and was dried and imidized at 250° C. for 15 seconds, at 350° C. for 15 seconds, and at 450° C. for 110 seconds, and a polyimide film having a thickness of 18 μm was obtained. With respect to the obtained polyimide film, and with respect to a laminate obtained by laminating members such that the laminate has a structure of polyimide film/tetrafluoroethylene-hexafluoropropylene copolymer (FEP) film (12 μm)/0.9 mmφ conducting wire/FEP film (12 μm)/polyimide film, by laminating members so as to form a structure of SUS plate/cushioning material (Kinyo board (manufactured by Kinyosha Co., Ltd.))/the above-described laminate/cushioning material (Kinyo board (manufactured by Kinyosha Co., Ltd.))/SUS plate and applying a pressure of 80 kgf/cm² to the structure at 285° C. for 10 minutes, a laminate was obtained. Time required from when the chemical dehydrating agent and the catalyst and the DMF were contained in the polyimide precursor to when the laminate was obtained was 0.9 hours. With respect to the obtained laminate, the abrasion property was measured using the device and protocol described in British Standard Aerospace Series BS EN3475-503. The measurement was performed 5 times, and an average value thereof was used as the abrasion property. The measurement was performed under an environment of 23° C. and 55% RH. For the measurement, the Repeated Scrape Abrasion Tester (Cat 158L238G1), manufactured by WELLMAN Co., Ltd., was used. Further, for the conducting wire, a high performance conductor nickel coated copper (AWG: 20, CONST: 19/32, diameter: 0.9 mm) manufactured by Phelps Dodge Corporation was used. The result is shown in Table 1.

<Preparation of Long Tape-Like Insulating Coating Material for Abrasion Resistance Test>
The polyimide precursor obtained in Synthesis Example (1A) contained the following chemical dehydrating agent and catalyst and DMF.
Chemical dehydrating agent: 2.0 mol of acetic anhydride per 1 mol of an amic acid unit of the polyamic acid of the polyimide precursor
Catalyst: 0.8 mol of isoquinoline per 1 mol of an amic acid unit of the polyamic acid of the polyimide precursor
DMF: In a weight such that a total weight of the chemical dehydrating agent and the catalyst and the DMF is 50% of a weight of the polyimide precursor
Next, the polyimide precursor containing the chemical dehydrating agent and the catalyst and the DMF was continuously extruded from a multi-manifold die having a lip width of 520 mm cooled to about 0° C., and was cast on an endless belt made of SUS running 50 mm below the die. After the casting, heating was performed for 110 seconds stepwise in a temperature range of 50° C.-140° C., and a gel film that had developed a self-supporting property was peeled off from the SUS endless belt. The peeled gel film was fixed to a pin sheet and was dried and imidized stepwise in a temperature range of 250° C.-400° C. The obtained polyimide film had a thickness of 18 μm.
An FEP (tetrafluoroethylene-hexafluoropropylene copolymer) aqueous dispersion was applied on both sides of the obtained polyimide film such that an FEP layer on each side of the polyimide film had a thickness of 2 μm. The resulting structure was dried at a temperature of 150° C. for 65 second and was fired at a temperature of 420° C. for 15 seconds, and thus an insulating coating material having a structure of FEP/polyimide/FEP and a total thickness of 22 μm was prepared. The obtained insulating coating material was slit into a tape shape to obtain a long tape-like insulating coating material. The obtained long tape-like insulating coating material was spirally wound around a 0.9 mmφ conducting wire (high performance conductor nickel coated copper (AWG: 20, CONST: 19/32) manufactured by Phelps Dodge Corporation) to obtain a long wire. Time required from when the chemical dehydrating agent and the catalyst and the DMF were contained in the polyimide precursor to when the long wire was obtained was 96 hours. With respect to the obtained long wire, measurement was performed five times according to British Standard Aerospace Series BS EN3475-503, and an average value thereof was used as the abrasion resistance. For the measurement, the Repeated Scrape Abrasion Tester (Cat 158L238G1), manufactured by WELLMAN Co., Ltd., was used. The result is shown in Table 1.

Example (2A)

<Preparation of Laminate of the Present Invention>
A polyimide film was prepared in the same manner as in Example (1A). The obtained polyimide film had a thickness of 18 μm. An FEP (tetrafluoroethylene-hexafluoropropylene copolymer) aqueous dispersion was applied on one side of the obtained polyimide film such that an FEP layer on the one side of the polyimide film had a thickness of 2 μm. The resulting structure was dried at a temperature of 150° C. for 65 second and was fired at a temperature of 420° C. for 15 seconds, and thus an insulating coating material having a structure of FEP/polyimide was prepared. With respect to the obtained insulating coating material, and with respect to a laminate obtained by laminating members such that the laminate has a structure of insulating coating material/0.9 mmφ conducting wire/insulating coating material in which the FEP (tetrafluoroethylene-hexafluoropropylene copolymer) surface of the insulating coating material is in contact with the conducting wire, by laminating members so as to have a structure of SUS plate/cushioning material/the above-described laminate/cushioning material/SUS plate and applying a pressure of 80 kgf/cm² at 305° C. for 20 minutes, a laminate was obtained. Further, for the conducting wire, a high performance conductor nickel coated copper (AWG: 20, CONST: 19/32, diameter: 0.9 mm) manufactured by Phelps Dodge Corporation was used. Time required from when the chemical dehydrating agent and the catalyst and the DMF were contained in the polyimide precursor to when the laminate was obtained was 1.5 hours. With respect to the obtained laminate, the abrasion property was evaluated in the same manner as in Example (1A). The result is shown in Table 1.

<Preparation of Long Tape-Like Insulating Coating Material for Abrasion Resistance Test>

A polyimide film was prepared in the same manner as in Example (1A). The obtained polyimide film had a thickness of 18 μm. An insulating coating material having a total thickness of 20 μm was obtained in the same manner as in Example (1A) except that an FEP (tetrafluoroethylene-hexafluoropropylene copolymer) aqueous dispersion was applied on one side of the obtained polyimide film such that an FEP layer on the one side of the polyimide film had a thickness of 2 μm. Using the obtained insulating coating material, a long wire was obtained in the same manner as in Example (1A). Time required from when the chemical dehydrating agent and the catalyst and the DMF were contained in the polyimide precursor to when the long wire was obtained was 96 hours. With respect to the obtained long wire, the abrasion resistance was evaluated in the same manner as in Example (1A). The result is shown in Table 1.

Example (3A)

<Preparation of Laminate of the Present Invention>

A polyimide film was prepared in the same manner as in Example (1A). The obtained polyimide film had a thickness of 18 μm. A laminate was obtained in the same manner as in Example (2A) except that an FEP (tetrafluoroethylene-hexafluoropropylene copolymer) aqueous dispersion was applied on both sides of the obtained polyimide film such that an FEP layer on each side of the polyimide film had a thickness of 2 μm. Time required from when the chemical dehydrating agent and the catalyst and the DMF were contained in the polyimide precursor to when the laminate was obtained was 2.0 hours. With respect to the obtained laminate, the abrasion property was evaluated in the same manner as in Example (1A). The result is shown in Table 1.

<Preparation of Long Tape-Like Insulating Coating Material for Abrasion Resistance Test>

A polyimide film was prepared in the same manner as in Example (1A). The obtained polyimide film had a thickness of 18 μm. An insulating coating material having a total thickness of 22 μm was obtained in the same manner as in Example (2A) except that an FEP (tetrafluoroethylene-hexafluoropropylene copolymer) aqueous dispersion was applied on both sides of the obtained polyimide film such that an FEP layer on each side of the polyimide film had a thickness of 2 μm. Using the obtained insulating coating material, a long wire was obtained in the same manner as in Example (2A). Time required from when the chemical dehydrating agent and the catalyst and the DMF were contained in the polyimide precursor to when the long wire was obtained was 96 hours. With respect to the obtained long wire, the abrasion resistance was evaluated in the same manner as in Example (1A). The result is shown in Table 1.

Example (4A)

<Preparation of Laminate of the Present Invention>

A polyimide film was prepared in the same manner as in Example (1A) except that the polyimide precursor (2A) obtained in Synthesis Example (2A) was used. The obtained polyimide film had a thickness of 20 μm. With respect to the obtained polyimide film, a laminate was prepared in the same manner as in Example (1A). Time required from when the chemical dehydrating agent and the catalyst and the DMF were contained in the polyimide precursor to when the laminate was obtained was 0.9 hours. With respect to the obtained laminate, the abrasion property was evaluated in the same manner as in Example (1A). The result is shown in Table 1.

<Preparation of Long Tape-Like Insulating Coating Material for Abrasion Resistance Test>

A polyimide film was prepared in the same manner as in Example (1A) except that the polyimide precursor (2A) obtained in Synthesis Example (2A) was used. The obtained polyimide film had a thickness of 20 μm Using the obtained polyimide film, an insulating coating material was obtained in the same manner as in Example (1A). Using the obtained insulating coating material, a long wire was obtained in the same manner as in Example (1A). Time required from when the chemical dehydrating agent and the catalyst and the DMF were contained in the polyimide precursor to when the long wire was obtained was 96 hours. With respect to the obtained long wire, the abrasion resistance was evaluated in the same manner as in Example (1A). The result is shown in Table 1.

Comparative Example (1A)

<Preparation of Laminate of the Present Invention>

As a polyimide film, an Apical AV (US product name (expressed as "Apical AH" in Japan)) having a thickness of 25 μm was used, and a laminate was obtained in the same manner as in Example (1A). Time required to obtain the laminate was 0.9 hours. With respect to the obtained laminate, the abrasion property was evaluated in the same manner as in Example (1A). The result is shown in Table 1.

<Preparation of Long Tape-Like Insulating Coating Material for Abrasion Resistance Test>

As a long polyimide film, an Apical AV having a thickness of 25 μm was used, and an insulating coating material having a structure of FEP/polyimide/FEP was prepared in the same manner as in Example (1A). Using the obtained insulating coating material, a long wire was obtained in the same manner as in Example (1A). Time required from a state of a film to when the long wire was obtained was 48 hours. With respect to the obtained long wire, the abrasion resistance was evaluated in the same manner as in Example (1A). The result is shown in Table 1.

Comparative Example (2A)

<Preparation of Laminate of the Present Invention>

As a polyimide film, Kapton E having a thickness of 25 μm was used, and a laminate was obtained in the same manner as in Example (1A) Time required to obtain the laminate was 0.5 hours. With respect to the obtained laminate, the abrasion property was evaluated in the same manner as in Example (1A). The result is shown in Table 1.

<Preparation of Long Tape-Like Insulating Coating Material for Abrasion Resistance Test>

As a long polyimide film, Kapton E having a thickness of 25 μm was used, and an insulating coating material having a structure of FEP/polyimide/FEP was prepared in the same manner as in Example (1A). Using the obtained insulating coating material, a long wire was obtained in the same manner as in Example (1A). Time required from a state of a film to when the long wire was obtained was 48 hours. With respect to the obtained long wire, the abrasion resistance was evaluated in the same manner as in Example (1A). The result is shown in Table 1.

Comparative Example (3A)

<Preparation of Laminate of the Present Invention>

As a polyimide film, an Apical AV having a thickness of 19 μm was used, and a laminate was obtained in the same manner as in Example (1A). Time required to obtain the laminate was 0.9 hours. With respect to the obtained laminate, the abrasion property was evaluated in the same manner as in Example (1A). The result is shown in Table 1.

<Preparation of Long Tape-Like Insulating Coating Material for Abrasion Resistance Test>

As a long polyimide film, an Apical AV having a thickness of 19 μm was used, and an insulating coating material having a structure of FEP/polyimide/FEP was prepared in the same manner as in Example (1A). Using the obtained insulating coating material, a long wire was obtained in the same manner as in Example (1A). Time required from a state of a film to when the long wire was obtained was 48 hours. With respect to the obtained long wire, the abrasion resistance was evaluated in the same manner as in Example (1A). The result is shown in Table 1.

Comparative Example (4A)

<Preparation of Laminate of the Present Invention>

A polyimide film was prepared in the same manner as in Example (1A) except that the polyimide precursor (3A) obtained in Synthesis Example (3A) was used. The obtained polyimide film had a thickness of 19 μm. With respect to the obtained polyimide film, a laminate was prepared in the same manner as in Example (1A). Time required from when the chemical dehydrating agent and the catalyst and the DMF were contained in the polyimide precursor to when the laminate was obtained was 0.9 hours. With respect to the obtained laminate, the abrasion property was evaluated in the same manner as in Example (1A). The result is shown in Table 1.

<Preparation of Long Tape-Like Insulating Coating Material for Abrasion Resistance Test>

A polyimide film was prepared in the same manner as in Example (1A) except that the polyimide precursor (3A) obtained in Synthesis Example (3A) was used. The obtained polyimide film had a thickness of 18 μm Using the obtained polyimide film, an insulating coating material was obtained in the same manner as in Example (1A). Using the obtained insulating coating material, a long wire was obtained in the same manner as in Example (1A).

Time required from when the chemical dehydrating agent and the catalyst and the DMF were contained in the polyimide precursor to when the long wire was obtained was 96 hours. With respect to the obtained long wire, the abrasion resistance was evaluated in the same manner as in Example (1A). The result is shown in Table 1.

Comparative Example (5A)

<Preparation of Laminate of the Present Invention>

A polyimide film was prepared in the same manner as in Example (1A) except that the polyimide precursor (4A) obtained in Synthesis Example 4 was used and drying and imidization was performed at 120° C. for 150 seconds, at 250° C. for 18 seconds, at 350° C. for 18 seconds, and at 450° C. for 120 seconds. The obtained polyimide film had a thickness of 25 μm. With respect to the obtained polyimide film, a laminate was prepared in the same manner as in Example (1A). Time required from when the chemical dehydrating agent and the catalyst and the DMF were contained in the polyimide precursor to when the laminate was obtained was 0.9 hours. With respect to the obtained laminate, the abrasion resistance was evaluated in the same manner as in Example (1A). The result is shown in Table 1.

<Preparation of Long Tape-Like Insulating Coating Material for Abrasion Resistance Test>

A polyimide film was prepared in the same manner as in Example (1A) except that the polyimide precursor (4A) obtained in Synthesis Example 4 was used. The obtained polyimide film had a thickness of 25 μm. Using the obtained polyimide film, an insulating coating material was obtained in the same manner as in Example (1A). Using the obtained insulating coating material, a long wire was obtained in the same manner as in Example (1A).

Time required from when the chemical dehydrating agent and the catalyst and the DMF were contained in the polyimide precursor to when the long wire was obtained was 96 hours. With respect to the obtained long wire, the abrasion resistance was evaluated in the same manner as in Example (1A). The result is shown in Table 1.

TABLE 1

| Example/ Comparative Example | Type | Molar Ratio | | | | | | Insulating Film Thickness μm | Abrasion Property times | Abrasion Resistance times |
| | | Diamine | | | Acid Dianhydride | | | | | |
| | | ODA mol % | PDA mol % | BAPP mol % | PMDA mol % | BTDA mol % | BPDA mol % | | | |
|---|---|---|---|---|---|---|---|---|---|---|
| Example 1A | Polyimide Precursor 1A | 50 | 50 | 0 | 55 | 23 | 22 | 18 | 4.8 | 500 |
| Example 2A | Polyimide Precursor 1A | 50 | 50 | 0 | 55 | 23 | 22 | 18 | 4.7 | 495 |

TABLE 1-continued

| Example/ Comparative Example | Type | Molar Ratio | | | | | | Insulating Film Thickness µm | Abrasion Property times | Abrasion Resistance times |
|---|---|---|---|---|---|---|---|---|---|---|
| | | Diamine | | | Acid Dianhydride | | | | | |
| | | ODA mol % | PDA mol % | BAPP mol % | PMDA mol % | BTDA mol % | BPDA mol % | | | |
| Example 3A | Polyimide Precursor 1A | 50 | 50 | 0 | 55 | 23 | 22 | 18 | 4.9 | 500 |
| Example 4A | Polyimide Precursor 2A | 32 | 50 | 18 | 80 | 20 | 0 | 20 | 4.1 | 406 |
| Comparative Example 1A | Apical AV | — | — | — | — | — | — | 25 | 4.0 | 385 |
| Comparative Example 2A | Kapton E | — | — | — | — | — | — | 25 | 8.9 | 860 |
| Comparative Example 3A | Apical AV | — | — | — | — | — | — | 19 | 1.0 | 101 |
| Comparative Example 4A | Polyimide Precursor 3A | 40 | 60 | 0 | 60 | 0 | 40 | 19 | 2.9 | 290 |
| Comparative Example 5A | Polyimide Precursor 4A | 100 | 0 | 0 | 100 | 0 | 0 | 25 | 3.9 | 380 |

Examples (B)

(Elastic Modulus Measurement of Insulating Film)

Tensile elastic modulus measurement was performed according to ASTM D882. For the measurement, an Autograph AGS-J manufactured by Shimadzu Corporation was used (sample measurement range: width: 15 mm; distance between jaws: 100 mm, tensile speed: 200 mm/min, measurement temperature: 23° C.).

(Sample Preparation for Abrasion Property Evaluation)

A sample for evaluation was obtained by laminating members to obtain a laminate having a structure of insulating film (4 cm×20 cm)/adhesion layer (3 cm×18 cm)/conducting wire (30 cm)/adhesion layer (3 cm×23 cm)/insulating film (4 cm×25 cm) and then laminating members so as to form a structure of SUS plate (3 mm thickness; mirror finish)/cushioning material (Kinyo board (manufactured by Kinyosha Co., Ltd.))/the above-described laminate/cushioning material (Kinyo board (manufactured by Kinyosha Co., Ltd.))/SUS plate (3 mm thickness; mirror finish), and applying a pressure of 80 kgf/cm² to the structure at 285° C. for 10 minutes. For the pressure bonding, a compression molding machine (SFA-50 type) manufactured by Shinto Metal Industries Corporation was used. For the conducting wire, a high performance conductor nickel coated copper (AWG: 20, CONST: 19/32, diameter: 0.9 mm) manufactured by Phelps Dodge Corporation was used. For the adhesion layer, a tetrafluoroethylene-hexafluoropropylene copolymer (FEP) film having a thickness of 12 µm was used.

(Measurement of Abrasion Property)

The abrasion property of the obtained sample for abrasion property evaluation was measured at 23° C. using the device and protocol described in British Standard Aerospace Series BS EN3475-503. The measurement was performed 5 times, and an average value thereof was used as the abrasion property. As a measurement device, the Repeated Scrape Abrasion Tester (Cat 158L238G1), manufactured by WELLMAN Co., Ltd., was used.

(Evaluation of Hydrolysis Resistance)

The hydrolysis resistance was evaluated using tear strength retention rates before and after a PCT test (pressure cooker test). The tear strength was measured at a temperature of 23° C. before and after a PCT processing according to ASTM D-1938. The measurement was performed three times for each sample, and an average value thereof was used as the tear strength. The PCT processing was performed for 96 hours under conditions of 150° C., 100% RH, 0.4 MPa. A value obtained by dividing the tearing strength after the PCT by the tearing strength before the PCT was used as a tear strength PCT retention rate (%).

Synthesis Example (1B): Synthesis of Polyimide Precursor (1B)

828.5 g of DMF was charged into a kettle having a capacity of 2 L; 97.7 g of 3,3',4,4'-biphenyltetracarboxylic acid dianhydride (BPDA) was added; 16.0 g of 3,3',4,4'-benzophenonetetracarboxylic acid dianhydride (BTDA) was added; 40.0 g of p-phenylenediamine (PDA) was added; and the mixture was stirred for 1 hour to dissolve. A separately prepared DMF solution (7 wt %) of PDA was gradually added to the above reaction solution until viscosity at 23° C. reached 2400 poise, and thus a polyimide precursor (1B) was obtained.

Synthesis Example (2B): Synthesis of Polyimide Precursor (2B)

812.5 g of DMF was charged into a kettle having a capacity of 2 L; 37.5 g of 4,4'-oxydianiline (ODA) was added; 19.8 g of 3,3',4,4'-biphenyltetracarboxylic acid dianhydride (BPDA) was added, 32.6 g of 3,3',4,4'-benzophenonetetracarboxylic acid dianhydride (BTDA) was added; and the mixture was stirred for 50 minutes to dissolve. Here, 20.2 g of p-phenylenediamine (PDA) was added; 42.5 g of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2400 poise, and thus a polyimide precursor (2B) was obtained.

Synthesis Example (3B): Synthesis of Polyimide Precursor (3B)

812.8 g of DMF was charged into a kettle having a capacity of 2 L; 18.3 g of 2,2-bis[4-(4-aminophenoxy)phenyl]propane (BAPP) was added; 28.2 g of 4,4'-oxydianiline (ODA) was added; 23.9 g of 3,3',4,4'-benzophenonetetracarboxylic acid dianhydride (BTDA) was added; 20.2 g of pyromellitic acid dianhydride (PMDA) was added; and the mixture was stirred for 50 minutes to dissolve. Here, 20.0 g of p-phenylenediamine (PDA) was added; 42.0 g of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2400 poise, and thus a polyimide precursor (3B) was obtained.

Synthesis Example (4B): Synthesis of Polyimide Precursor (4B)

812.1 g of DMF was charged into a kettle having a capacity of 2 L; 20.5 g of p-phenylenediamine (PDA) was added; 39.0 g of 3,3',4,4'-biphenyltetracarboxylic acid dianhydride (BPDA) was added; 12.2 g of 3,3',4,4'-benzophenonetetracarboxylic dianhydride (BTDA) was added; and the mixture was stirred for 50 minutes to dissolve. Here, 37.9 g of 4,4'-oxydianiline (ODA) was added; 42.9 g of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2400 poise, and thus a polyimide precursor (4B) was obtained.

Synthesis Example (5B) Synthesis of Polyimide Precursor (5B)

815.2 g of DMF was charged into a kettle having a capacity of 2 L; 39.4 g of 2,2-bis[4-(4-aminophenoxy)phenyl]propane (BAPP) was added; 15.1 g of 4,4'-oxydianiline (ODA) was added; 22.1 g of 3,3',4,4'-benzophenonetetracarboxylic acid dianhydride (BTDA) was added; 18.7 g of pyromellitic acid dianhydride (PMDA) was added; and the mixture was stirred for 50 minutes to dissolve. Here, 18.5 g of p-phenylenediamine (PDA) was added; 38.9 g of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2400 poise, and thus a polyimide precursor (5B) was obtained.

Synthesis Example (6B): Synthesis of Polyimide Precursor (6B)

810.8 g of DMF was charged into a kettle having a capacity of 2 L; 31.5 g of 4,4'-oxydianiline (ODA) was added; 25.6 g of p-phenylenediamine (PDA) was added; 46.4 g of 3,3',4,4'-biphenyltetracarboxylic acid dianhydride (BPDA) was added; 49.0 g of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2400 poise, and thus a polyimide precursor (6B) was obtained.

Example (1B)

The polyimide precursor (1B) (90 g) obtained in Synthesis Example (1B) contained the following chemical dehydrating agent and catalyst and DMF.

Figure 2:
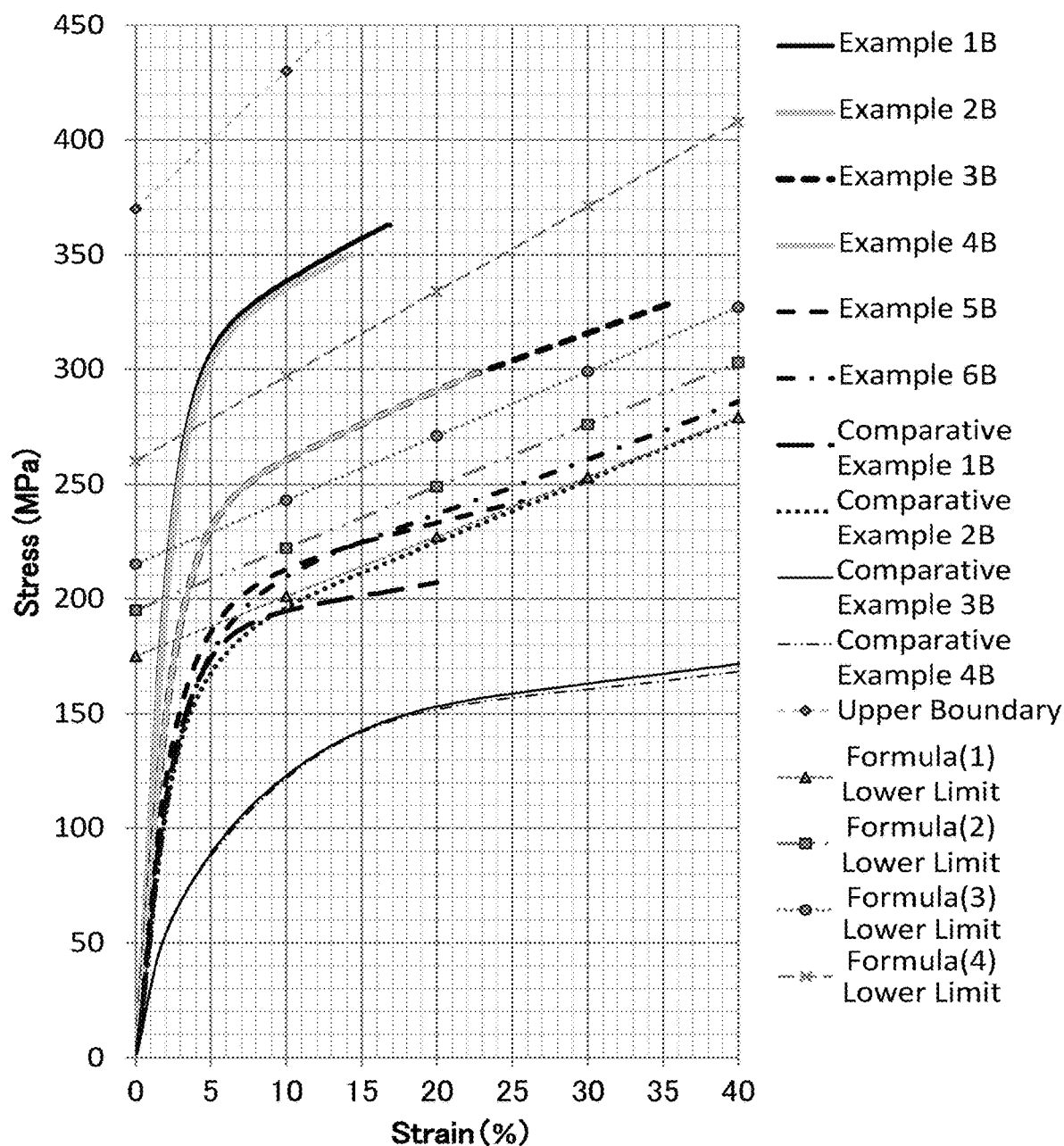
FIG. 2 illustrates stress-strain curves according to Examples (B) and Comparative Examples (B).
Figure 3:
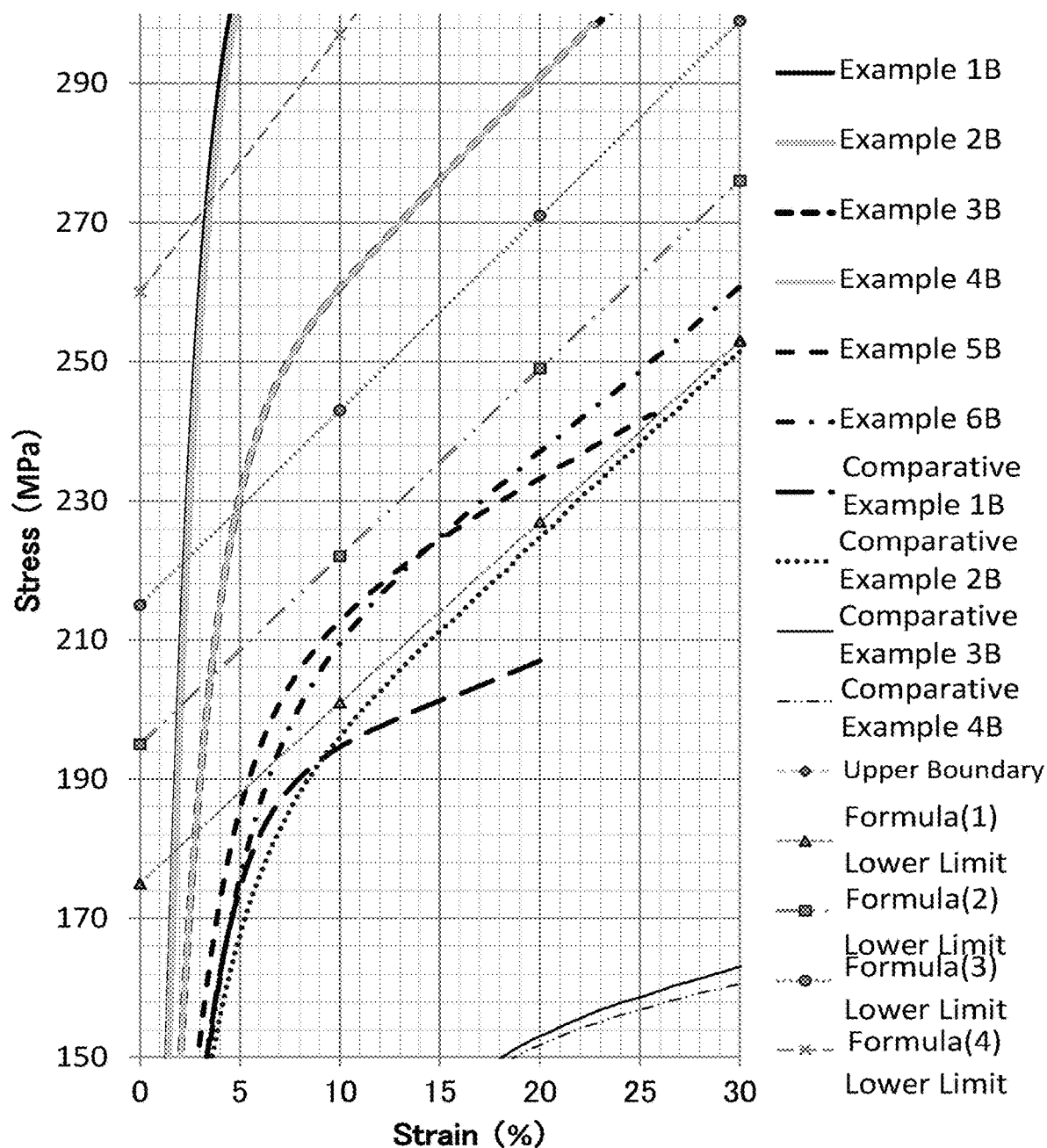
FIG. 3 illustrates an enlarged view of a portion of FIG. 2.
Figure 4:
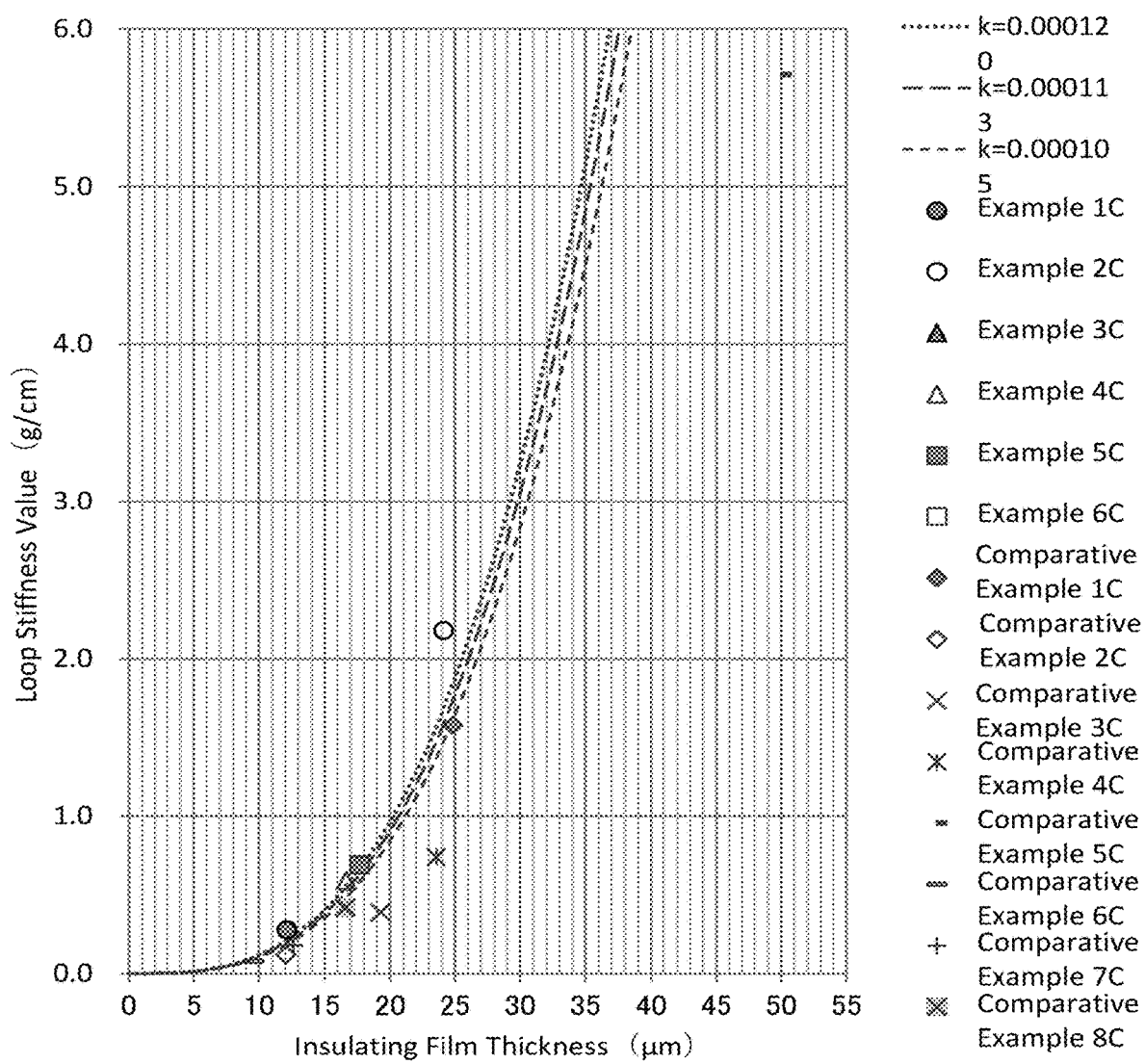
FIG. 4 illustrates a relation between a thickness of an insulating film and a loop stiffness value according to Examples (C).
Figure 5:
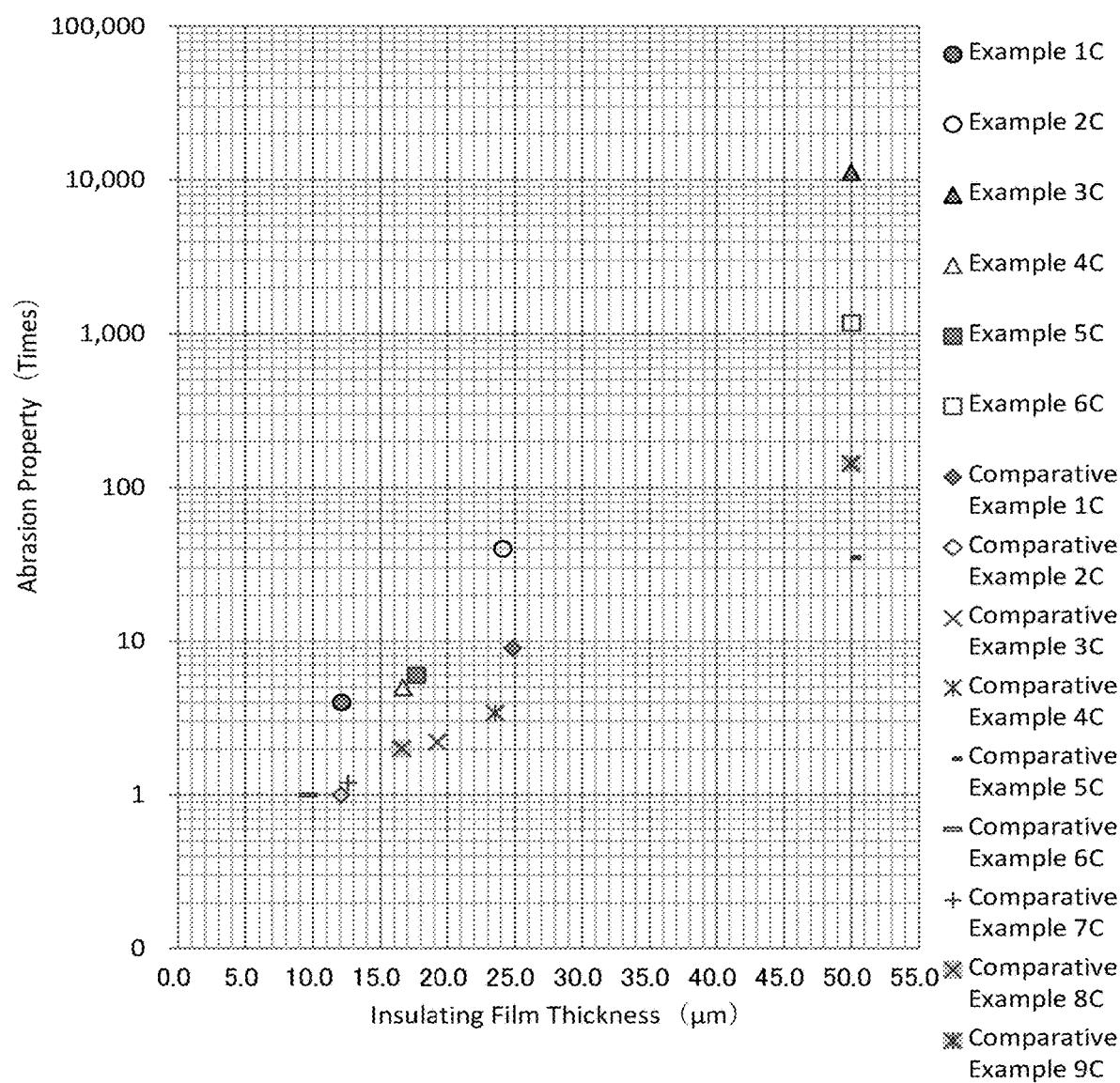
FIG. 5 illustrates a relation between a thickness of an insulating film and an abrasion property according to Examples (C).
Figure 6:
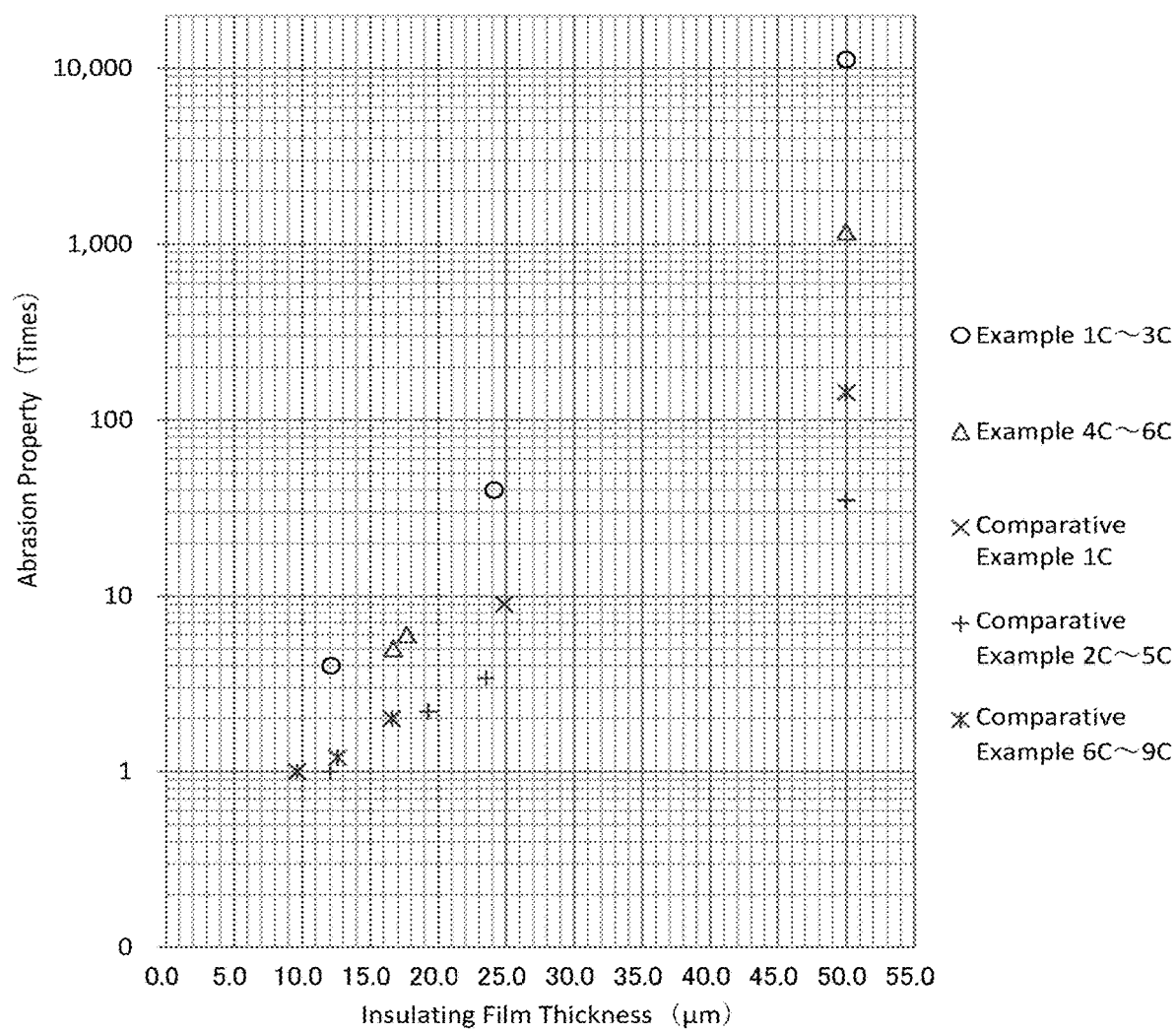
FIG. 6 illustrates a relation between a thickness of an insulating film and an abrasion property according to Examples (C).

Chemical dehydrating agent: 2.5 mol of acetic anhydride per 1 mol of an amic acid unit of the polyamic acid of the polyimide precursor
Catalyst: 0.6 mol of isoquinoline per 1 mol of an amic acid unit of the polyamic acid of the polyimide precursor
DMF: In a weight such that a total weight of the chemical dehydrating agent and the catalyst and the DMF is 45% of a weight of the polyimide precursor The mixture was stirred and defoamed at a temperature of 0° C. or less, and was applied by casting on an aluminum foil using a comma coater. This resin film was heated at 125° C. for 120 seconds. Thereafter a self-supporting gel film was peeled off from the aluminum foil and was fixed to a metal frame, and was dried and imidized at 250° C. for 15 seconds, at 350° C. for 15 seconds, and at 450° C. for 130 seconds, and a polyimide film having a thickness of 17 μm was obtained. With respect to the obtained polyimide film, elastic modulus measurement was performed to obtain a stress-strain curve. Subsequently, with respect to the obtained polyimide film, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned between an upper limit and a lower limit of Formula (1). That is, it was demonstrated that the stress (x) and the strain (a) in Example (1B) satisfy Formula (1).

Example (2B)

A polyimide film having a thickness of 19 μm was obtained under the same conditions as in Example (1B). With respect to the obtained polyimide film, elastic modulus measurement was performed to obtain a stress-strain curve. Subsequently, with respect to the obtained polyimide film, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned between an upper limit and a lower limit of Formula (1). That is, it was demonstrated that the stress (x) and the strain (a) in Example (2B) satisfy Formula (1).

Example (3B)

Polyimide films respectively having thickness of 17 μm and 19 μm were obtained by performing the same operation as Example (1B) except that the polyimide precursor (2B) (90 g) obtained in Synthesis Example (2B) contained the following chemical dehydrating agent and catalyst and DMF.
Chemical dehydrating agent: 2.1 mol of acetic anhydride per 1 mol of an amic acid unit of the polyamic acid of the polyimide precursor
Catalyst: 0.9 mol of isoquinoline per 1 mol of an amic acid unit of the polyamic acid of the polyimide precursor
DMF: In a weight such that a total weight of the chemical dehydrating agent and the catalyst and the DMF is 54% of a weight of the polyimide precursor With respect to the obtained polyimide film having a thickness of 17 μm, elastic modulus measurement was performed to obtain a stress-strain curve. Subsequently, with respect to the obtained polyimide film, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned between an upper limit and a lower limit of Formula (1). That is, it was demonstrated that the stress (x) and the strain (a) in Example (3B) satisfy Formula (1).

Example (4B)

A polyimide film having a thickness of 19 µm was obtained under the same conditions as in Example (2B). With respect to the obtained polyimide film, elastic modulus measurement was performed to obtain a stress-strain curve. Subsequently, with respect to the obtained polyimide film, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned between an upper limit and a lower limit of Formula (1). That is, it was demonstrated that the stress (x) and the strain (a) in Example (4B) satisfy Formula (1).

Example (5B)

A polyimide film having a thickness of 17 µm was obtained by performing the same operation as in Example (2B) except that the polyimide precursor (3B) (90 g) obtained in Synthesis Example (3B) was used. With respect to the obtained polyimide film, elastic modulus measurement was performed to obtain a stress-strain curve. Subsequently, with respect to the obtained polyimide film, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned between an upper limit and a lower limit of Formula (1). That is, it was demonstrated that the stress (x) and the strain (a) in Example (5B) satisfy Formula (1).

Example (6B)

A polyimide film having a thickness of 17 µm was obtained by performing the same operation as in Example (2B) except that the polyimide precursor (4B) (90 g) obtained in Synthesis Example (4B) was used. With respect to the obtained polyimide film, elastic modulus measurement was performed to obtain a stress-strain curve. Subsequently, with respect to the obtained polyimide film, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned between an upper limit and a lower limit of Formula (1). That is, it was demonstrated that the stress (x) and the strain (a) in Example (6B) satisfy Formula (1).

Comparative Example (1B)

A polyimide film having a thickness of 17 µm was obtained by performing the same operation as in Example (2B) except that the polyimide precursor (5B) (90 g) obtained in Synthesis Example (5B) was used. With respect to the obtained polyimide film, elastic modulus measurement was performed to obtain a stress-strain curve. Subsequently, with respect to the obtained polyimide film, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned below a lower limit of Formula (1). That is, it was demonstrated that the stress (x) and the strain (a) in Comparative Example (1B) do not satisfy Formula (1).

Comparative Example (2B)

A polyimide film having a thickness of 17 µm was obtained by performing the same operation as in Example (2B) except that the polyimide precursor (6B) (90 g) obtained in Synthesis Example (6B) was used. With respect to the obtained polyimide film, elastic modulus measurement was performed to obtain a stress-strain curve. Subsequently, with respect to the obtained polyimide film, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned below a lower limit of Formula (1). That is, it was demonstrated that the stress (x) and the strain (a) in Comparative Example (2B) do not satisfy Formula (1).

Comparative Example (3B)

With respect to an Apical AH having a thickness of 19 µm (polyimide film manufactured by Kaneka Corporation), elastic modulus measurement was performed to obtain a stress-strain curve. Subsequently, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned below a lower limit of Formula (1). That is, it was demonstrated that the stress (x) and the strain (a) in Comparative Example (3B) do not satisfy Formula (1).

Comparative Example (4B)

With respect to an Apical AH having a thickness of 50 µm (polyimide film manufactured by Kaneka Corporation), elastic modulus measurement was performed to obtain a stress-strain curve. Subsequently, a sample for abrasion property evaluation was prepared, and the abrasion property was evaluated. The result is shown in Table 2. Further, a graph plotting the stress (x) and the strain (a) is shown in FIG. 2. In FIG. 2, the stress (x) and the strain (a) were positioned below a lower limit of Formula (1). That is, it was demonstrated that the stress (x) and the strain (a) in Comparative Example (4B) do not satisfy Formula (1).

TABLE 2

| Example/Comparative Example | Formulation | Molar Ratio | | | | | | Yield Strength MPa | Relational Formula (1) | Insulating Film Thickness μm | Elastic Modulus GPa | Hydrolysis Resistance (Tear Strength PCT Retention Rate %) | Abrasion Property times |
|---|---|---|---|---|---|---|---|---|---|---|---|---|---|
| | | Diamine | | | Acid Dianhydride | | | | | | | | |
| | | ODA % | PDA % | BAPP % | PMDA % | BTDA % | BPDA % | | | | | | |
| Example 1B | Synthesis Example 1B | 0 | 100 | 0 | 0 | 13 | 87 | 292 | O | 17 | 11.5 | 81 | 10.2 |
| Example 2B | Synthesis Example 1B | 0 | 100 | 0 | 0 | 13 | 87 | 288 | O | 19 | — | — | 14.5 |
| Example 3B | Synthesis Example 2B | 50 | 50 | 0 | 55 | 27 | 18 | 230 | O | 17 | 8.6 | — | 5.1 |
| Example 4B | Synthesis Example 2B | 50 | 50 | 0 | 55 | 27 | 18 | 230 | O | 19 | — | 80 | 8.1 |
| Example 5B | Synthesis Example 38 | 38 | 50 | 12 | 80 | 20 | 0 | 179 | O | 17 | 7.5 | — | 2.3 |
| Example 6B | Synthesis Example 4B | 50 | 50 | 0 | 55 | 10 | 35 | 175 | O | 17 | 6.5 | — | 2.4 |
| Comparative Example 1B | Synthesis Example 5B | 22 | 50 | 28 | 80 | 20 | 0 | 167 | X | 17 | 7.0 | — | 1.2 |
| Comparative Example 2B | Synthesis Example 6B | 40 | 60 | 0 | 60 | 0 | 40 | 157 | X | 17 | 6.2 | — | 1.9 |
| Comparative Example 3B | Apical AH | — | — | — | — | — | — | 61 | X | 19 | 3.3 | 23 | 0.8 |
| Comparative Example 4B | Apical AH | — | — | — | — | — | — | 61 | X | 50 | 3.2 | — | 37.0 |

* In the "Relational Formula (1)" column, "O" indicates that the formula is satisfied, and "X" indicates that the formula is not satisfied Examples (C)

(Loop Stiffness Value and Thickness Measurement of Insulating Film)

Measurement was performed using a loop stiffness tester, manufactured by Toyo Seiki Seisaku-sho Ltd., under conditions that a sample width was 10 mm, a loop length was 50 mm, and a distance between squashings was 10 mm. A force when 2 minutes had passed after squashing was read. The measurement was performed three times for each sample, and an average value thereof was used as the loop stiffness value. With respect to an arbitrary place of a film included in the loop length, thickness measurement was performed at five points at substantially equal intervals in a longitudinal direction in a substantially central portion using a contact thickness gauge (MT12 manufactured by Heidenhain), and an average value thereof was used as the film thickness.

(Elastic Modulus Measurement of Insulating Film)

Tensile elastic modulus measurement was performed according to ASTM D882. For the measurement, an Autograph AGS-J manufactured by Shimadzu Corporation was used (sample measurement range: width: 15 mm; distance between jaws: 100 mm, tensile speed: 200 mm/min, measurement temperature: 23° C.).

(Sample Preparation for Abrasion Property Evaluation)

A sample for evaluation was obtained by laminating members to obtain a laminate having a structure of insulating film (4 cm×20 cm)/adhesion layer (3 cm×18 cm)/conducting wire (30 cm)/adhesion layer (3 cm×18 cm)/insulating film (4 cm×20 cm) and then laminating members so as to form a structure of SUS plate (3 mm thickness; mirror finish)/cushioning material (Kinyo board (manufactured by Kinyosha Co., Ltd.))/the above-described laminate/cushioning material (Kinyo board (manufactured by Kinyosha Co., Ltd.))/SUS plate (3 mm thickness; mirror finish), and applying a pressure of 80 kgf/cm² to the structure at 285° C. for 10 minutes. For the pressure bonding, a compression molding machine (SFA-50 type) manufactured by Shinto Metal Industries Corporation was used. For the conducting wire, a high performance conductor nickel coated copper (AWG: 20, CONST: 19/32, diameter: 0.9 mm) manufactured by Phelps Dodge Corporation was used. For the adhesion layer, a tetrafluoroethylene-hexafluoropropylene copolymer (FEP) film having a thickness of 12 μm was used.

(Measurement of Abrasion Property)

The abrasion property of the obtained sample for abrasion property evaluation was measured using the device and protocol described in British Standard Aerospace Series BS EN3475-503. The measurement was performed 5 times, and an average value thereof was used as the abrasion property. As a measurement device, the Repeated Scrape Abrasion Tester (Cat 158L238G1), manufactured by WELLMAN Co., Ltd., was used.

(Evaluation of Hydrolysis Resistance)

The hydrolysis resistance was evaluated using tear strength retention rates before and after a PCT test (pressure cooker test). The tear strength was measured at a temperature of 23° C. before and after a PCT processing according to ASTM D-1938. The measurement was performed three times for each sample, and an average value thereof was used as the tear strength. The PCT processing was performed for 96 hours under conditions of 150° C., 100% RH, 0.4 MPa. A value obtained by dividing the tearing strength after the PCT by the tearing strength before the PCT was used as a tear strength PCT retention rate (%).

(Calculation of k Value in Formula (1))

From the measurement results and the fact that the loop stiffness value is 0 g/cm when the film thickness is 0 μm, that is, when the film does not exists, a cubic equation "a (g/cm)=k×(b (µm))³" passing through the origin holds (where a is a measured value of the loop stiffness value, k is a coefficient, and b is a measured value of the film thickness). The k value was obtained by substituting the obtained loop stiffness value and the obtained thickness into the above-described equation. For example, when a loop stiffness value of a sample having a film thickness of 24.1 µm is 2.18 g/cm, k is 0.000155 (=2.18÷(24.1)³).

(Evaluation of Hydrolysis Resistance)

The hydrolysis resistance was evaluated using tear strength retention rates before and after a PCT test (pressure cooker test). The tear strength was measured before and after PCT processing according to ASTM D-1938. The measurement was performed three times for each sample, and an average value thereof was used as the tear strength. The PCT processing was performed for 96 hours under conditions of 150° C., 100% RH, 0.4 MPa. A value obtained by dividing the tearing strength after the PCT by the tearing strength before the PCT was used as a tear strength PCT retention rate.

Synthesis Example (1C): Synthesis of Polyimide Precursor (1C)

828.5 g of DMF was charged into a kettle having a capacity of 2 L; 100.1 g of 3,3',4,4'-biphenyltetracarboxylic acid dianhydride (BPDA) was added; 13.6 g of 3,3',4,4'-benzophenonetetracarboxylic acid dianhydride (BTDA) was added; 40.1 g of p-phenylenediamine (PDA) was added; and the mixture was stirred for 1 hour to dissolve. A separately prepared DMF solution (7 wt %) of PDA was gradually added to the above reaction solution until viscosity at 23° C. reached 2300 poise, and thus a polyimide precursor (1C) was obtained.

Synthesis Example (2C): Synthesis of Polyimide Precursor (2C)

812.3 g of DMF was charged into a kettle having a capacity of 2 L; 37.0 g of 4,4'-oxydianiline (ODA) was added; 22.2 g of 3,3',4,4'-biphenyltetracarboxylic acid dianhydride (BPDA) was added, 29.1 g of 3,3',4,4'-benzophenonetetracarboxylic acid dianhydride (BTDA) was added; and the mixture was stirred for 50 minutes to dissolve. Here, 20.8 kg of para-phenylenediamine (PDA) was added; 43.5 kg of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2300 poise, and thus a polyimide precursor (2C) was obtained.

Synthesis Example (3C): Synthesis of Polyimide Precursor (3C)

815.3 g of DMF was charged into a kettle having a capacity of 2 L; 39.2 g of 2,2-bis[4-(4-aminophenoxy)phenyl]propane (BAPP) was added; 15.0 g of 4,4'-oxydianiline (ODA) was added; 24.2 g of 3,3',4,4'-benzophenonetetracarboxylic acid dianhydride (BTDA) was added; 17.9 g of pyromellitic acid dianhydride (PMDA) was added; and the mixture was stirred for 50 minutes to dissolve. Here, 18.5 g of para-phenylenediamine (PDA) was added; 38.0 g of pyromellitic acid dianhydride (PMDA) was added; and the mixture was stirred for 1 hour to dissolve. A separately prepared DMF solution (7 wt %) of PMDA was gradually added to the above reaction solution until viscosity at 23° C. reached 2300 poise, and thus a polyimide precursor (3C) was obtained.

Examples (1C)-(3C)

The polyimide precursor (1C) obtained in Synthesis Example (1C) contained the following chemical dehydrating agent and catalyst and DMF.

Chemical dehydrating agent: 2.6 mol of acetic anhydride per 1 mol of an amic acid unit of the polyamic acid of the polyimide precursor Catalyst: 0.6 mol of isoquinoline per 1 mol of an amic acid unit of the polyamic acid of the polyimide precursor DMF: In a weight such that a total weight of the chemical dehydrating agent and the catalyst and the DMF is 45% of a weight of the polyimide precursor The obtained solution was stirred and defoamed at a temperature of 0° C. or less, and was applied by casting on an aluminum foil using a comma coater. This resin film was heated at 125° C. for 95 seconds. Thereafter a self-supporting gel film was peeled off from the aluminum foil and was fixed to a metal frame, and was dried and imidized at 250° C. for 12 seconds, at 350° C. for 12 seconds, and at 450° C. for 110 seconds, and a polyimide film having a thickness of about 12 µm was obtained.

Further, the obtained solution was stirred and defoamed at a temperature of 0° C. or less, and was applied by casting on an aluminum foil using a comma coater. This resin film was heated at 125° C. for 110 seconds. Thereafter a self-supporting gel film was peeled off from the aluminum foil and was fixed to a metal frame, and was dried and imidized at 250° C. for 15 seconds, at 350° C. for 15 seconds, and at 450° C. for 130 seconds, and a polyimide film having a thickness of about 24 µm was obtained.

Next, the obtained solution was stirred and defoamed at a temperature of 0° C. or less, and was applied by casting on an aluminum foil using a comma coater. This resin film was heated at 92° C. for 320 seconds. Thereafter a self-supporting gel film was peeled off from the aluminum foil and was fixed to a metal frame, and was dried and imidized at 150° C. for 65 seconds, at 250° C. for 65 seconds, and at 450° C. for 150 seconds, and a polyimide film having a thickness of about 50 µm was obtained.

With respect to the obtained film, the loop stiffness value and the abrasion property were measured. The k value calculated from the loop stiffness value was larger than 0.000105. Further, with respect to the film having a thickness of 24 µm, elastic modulus measurement was also performed.

The result is shown in Table 3.

Examples (4C)-(6C)

The polyimide precursor (2C) obtained in Synthesis Example (2C) contained the following chemical dehydrating agent and catalyst and DMF.

Chemical dehydrating agent: 2.1 mol of acetic anhydride per 1 mol of an amic acid unit of the polyamic acid of the polyimide precursor Catalyst: 0.8 mol of isoquinoline per 1 mol of an amic acid unit of the polyamic acid of the polyimide precursor DMF: In a weight such that a total weight of the chemical dehydrating agent and the catalyst and the DMF is 50% of a weight of the polyimide precursor The obtained solution was stirred and defoamed at a temperature of 0° C. or less, and was applied by casting on an aluminum foil using a comma coater. This resin film was heated at 125° C. for 110 seconds. Thereafter a self-supporting gel film was peeled off from the aluminum foil and was fixed to a metal frame, and was dried and imidized at 250° C. for 15 seconds, at 350° C. for 15 seconds, and at 450° C. for 130 seconds, and polyimide films respectively having thicknesses of about 18 μm and about 17 μm were obtained.

Next, the obtained solution was stirred and defoamed at a temperature of 0° C. or less, and was applied by casting on an aluminum foil using a comma coater. This resin film was heated at 92° C. for 320 seconds. Thereafter a self-supporting gel film was peeled off from the aluminum foil and was fixed to a metal frame, and was dried and imidized at 150° C. for 65 seconds, at 250° C. for 65 seconds, at 350° C. for 65 seconds, and at 450° C. for 150 seconds, and a polyimide film having a thickness of about 50 μm was obtained.

With respect to the obtained film, the loop stiffness value and the abrasion property were measured. The k value calculated from the loop stiffness value was larger than 0.000105. Further, with respect to the film having a thickness of 18 μm, elastic modulus measurement was also performed. The result is shown in Table 3.

Comparative Example (1C)

With respect to a polyimide film (Kapton E) manufactured by DuPont having a thickness of 25 μm, poop stiffness value measurement was performed. The k value calculated from the loop stiffness value was 0.000103. The result is shown in Table 1. Further, elastic modulus measurement was also performed.

Comparative Examples (2C)-(5C)

Loop stiffness value and abrasion property measurements were performed with respect to polyimide films (Apical AV) manufactured by Kaneka Corporation, the films respectively having thicknesses of 12 μm, 19, μm, 24 μm and 50 μm. The k values calculated from the loop stiffness values were smaller than 0.00010.5. Further, with respect to the film having a thickness of 19 μm, elastic modulus measurement was also performed. The result is shown in Table 3.

Comparative Examples (6C)-(9C)

The polyimide precursor (3C) obtained in Synthesis Example (3C) contained the following chemical dehydrating agent and catalyst and DMF.
Chemical dehydrating agent: 2.1 mol of acetic anhydride per 1 mol of an amic acid unit of the polyamic acid of the polyimide precursor
Catalyst: 0.7 mol of isoquinoline per 1 mol of an amic acid unit of the polyamic acid of the polyimide precursor
DMF: In a weight such that a total weight of the chemical dehydrating agent and the catalyst and the DMF is 50% of a weight of the polyimide precursor The obtained solution was stirred and defoamed at a temperature of 0° C. or less, and was applied by casting on an aluminum foil using a comma coater. This resin film was heated at 125° C. for 95 seconds. Thereafter a self-supporting gel film was peeled off from the aluminum foil and was fixed to a metal frame, and was dried and imidized at 250° C. for 12 seconds, at 350° C. for 12 seconds, and at 450° C. for 110 seconds, and polyimide films respectively having a thickness of 10 μm and a thickness of 13 μm were obtained.

Further, the obtained solution was stirred and defoamed at a temperature of 0° C. or less, and was applied by casting on an aluminum foil using a comma coater. This resin film was heated at 125° C. for 110 seconds. Thereafter a self-supporting gel film was peeled off from the aluminum foil and was fixed to a metal frame, and was dried and imidized at 250° C. for 15 seconds, at 350° C. for 15 seconds, and at 450° C. for 130 seconds, and a polyimide film having a thickness of 17 μm was obtained.

Next, the obtained solution was stirred and defoamed at a temperature of 0° C. or less, and was applied by casting on an aluminum foil using a comma coater. This resin film was heated at 92° C. for 320 seconds. Thereafter a self-supporting gel film was peeled off from the aluminum foil and was fixed to a metal frame, and was dried and imidized at 150° C. for 65 seconds, at 250° C. for 65 seconds, at 350° C. for 65 seconds, and at 450° C. for 150 seconds, and a polyimide film having a thickness of 50 μm was obtained.

With respect to the obtained film, the loop stiffness value and the abrasion property were measured. The k value calculated from the loop stiffness value was smaller than 0.000105. Further, with respect to the film having a thickness of 17 μm, elastic modulus measurement was also performed. The result is shown in Table 3.

TABLE 3

| | | Molar Ratio | | | | | | | Film Characteristics | | | |
| | | Diamine | | | Acid Dianhydride | | | k in | Insulating Film Loop Stiffness | Insulating Film Thickness | Elastic Modulus | Hydrolysis Resistance (Tear Strength PCT Retention | Abrasion Property |
| Example/ Comparative Example | Formulation | ODA % | PDA % | BAPP % | PMDA % | BTDA % | BPDA % | Formula (1) | Value (a) g/cm | (b) um | GPa | Rate % | times |
| Example 1C | Precursor 1C | 0 | 100 | 0 | 0 | 11 | 89 | 0.000158 | 0.28 | 12.1 | — | 82 | 4.0 |
| Example 2C | Precursor 1C | 0 | 100 | 0 | 0 | 11 | 89 | 0.000156 | 2.18 | 24.1 | 11.4 | — | 40.0 |
| Example 3C | Precursor 1C | 0 | 100 | 0 | 0 | 11 | 89 | 0.000126 | 15.70 | 50.0 | — | — | 11200.0 |
| Example 4C | Precursor 2C | 49 | 51 | 0 | 56 | 24 | 20 | 0.000127 | 0.59 | 16.7 | — | — | 5.0 |
| Example 5C | Precursor 2C | 49 | 51 | 0 | 56 | 24 | 20 | 0.000124 | 0.69 | 17.7 | 8.5 | 83 | 6.0 |

TABLE 3-continued

| | | Molar Ratio | | | | | | k in Formula (1) | Film Characteristics | | | | |
|---|---|---|---|---|---|---|---|---|---|---|---|---|---|
| | | Diamine | | | Acid Dianhydride | | | | Insulating Film Loop Stiffness | Insulating Film Thickness | | Hydrolysis Resistance (Tear Strength PCT Retention | |
| Example/ Comparative Example | Formulation | ODA % | PDA % | BAPP % | PMDA % | BTDA % | BPDA % | | Value (a) g/cm | (b) um | Elastic Modulus GPa | Rate % | Abrasion Property times |
| Example 6C | Precursor 2C | 49 | 51 | 0 | 56 | 24 | 20 | 0.000106 | 13.20 | 50.0 | — | — | 1180.0 |
| Comparative Example 1C | Kapton | — | — | — | — | — | — | 0.000103 | 1.58 | 24.9 | 6.1 | — | 8.9 |
| Comparative Example 2C | Apical AV | — | — | — | — | — | — | 0.000068 | 0.12 | 12.1 | — | — | 1.0 |
| Comparative Example 3C | Apical AV | — | — | — | — | — | — | 0.000055 | 0.39 | 19.3 | 3.2 | 22 | 2.2 |
| Comparative Example 4C | Apical AV | — | — | — | — | — | — | 0.000057 | 0.74 | 23.6 | — | — | 3.4 |
| Comparative Example 5C | Anical AV | — | — | — | — | — | — | 0.000046 | 5.70 | 50.0 | — | — | 35.0 |
| Comparative Example 6C | Precursor 3C | 22 | 50 | 28 | 78 | 22 | 0 | 0.000090 | 0.08 | 9.6 | — | — | 1.0 |
| Comparative Example 7C | Precursor 3C | 22 | 50 | 28 | 78 | 22 | 0 | 0.000090 | 0.18 | 12.6 | — | — | 1.2 |
| Comparative Example 8C | Precursor 3C | 22 | 50 | 28 | 78 | 22 | 0 | 0.000092 | 0.42 | 16.6 | 7.0 | — | 2.0 |
| Comparative Example 9C | Precursor 3C | 22 | 50 | 28 | 78 | 22 | 0 | — | — | 50.0 | — | — | 143.0 |

Among durability characteristics that are desired for an insulating coating material, an important property is abrasion resistance. In particular, from a point of view of safety assurance, for an insulating coating material used for electric wires and cables for aerospace applications, it is preferable that the abrasion resistance be as high as possible. For example, the insulating coating material is required to be a material capable of withstanding friction when the electric wires and cables are installed in an aircraft and friction generated by vibration during flight. Therefore, the abrasion resistance is regarded as important for aerospace applications.

Further, light weight is demanded for the insulating coating material used for conducting wires such as electric wires and cables for aerospace applications such as an aircraft. In recent years, the demand for light weight has been increasing, and thinner insulating coating material is demanded. Therefore, development of a new insulating coating material that is thinner and has excellent abrasion resistance is strongly demanded. However, a thin insulating material having excellent abrasion resistance sufficient to meet the high level of demand of recent years has not been developed.

Therefore, an aspect of the present invention is to provide a thin insulating coating material having excellent abrasion resistance capable of being used for conducting wires such as electric wires and cables for aerospace applications such as an aircraft.

The embodiments of the present invention can solve the above problem by the following new insulating coating material and insulated cables or insulated wires for which the insulating coating material is used.

Further, as another aspect, as a result of an intensive study to solve the above problem by focusing on a stress-strain curve obtained by tensile elastic modulus measurement using an insulating film that forms an insulating coating material, and focusing on loop stiffness value of the insulating film that forms the insulating coating material, the present inventors found that the above problem can be solved by the following new insulating coating material and insulated cables for which the insulating coating material is used.

1) An insulating coating material has an adhesion layer on at least one side of an insulating film. An abrasion property of a laminate, which is obtained by laminating and integrating members such that the adhesion layer of the insulating coating material is in contact with a conducting wire and the laminate has a structure of insulating coating material/conducting wire/insulating coating material, is 3.0 times or more, and a thickness of the insulating film is 20 μm or less.

2) An insulating coating material has an adhesion layer on at least one side of an insulating film. Of the insulating film, yield strength obtained from a stress-strain curve, which is obtained by tensile elastic modulus measurement, is 160 MPa or more and a stress (x) (MPa) and a strain (a) (%) in a plastic deformation region satisfy the following Formula (1).

$$2.6 \times a + 175 < x < 6.0 \times a + 370 \tag{1}$$

3) An insulating coating material has an adhesion layer on at least one side of an insulating film. For the insulating film, in the following Formula (1) for a loop stiffness value (a) (g/cm) of the insulating film and a thickness (b) (μm) of the insulating film, k is 0.000105 or more.

$$a = k \times b^3 \tag{Formula 1}$$

When the insulating coating material according to an embodiment of the present invention is wound around a conducting wire to form an insulated wire, excellent abrasion resistance that is sufficient to meet the high level of demand in recent years can be obtained. Therefore, an insulating coating material having excellent abrasion resistance can be provided even when the insulating coating material is reduced in thickness and in weight.

INDUSTRIAL APPLICABILITY

The insulating coating material according to an embodiment of the present invention has excellent abrasion resistance and thus is useful, for example, for electric wires and cables for aerospace applications, and can also be used in various industrial fields.

Obviously, numerous modifications and variations of the present invention are possible in light of the above teachings. It is therefore to be understood that within the scope of the appended claims, the invention may be practiced otherwise than as specifically described herein.

What is claimed is:
1. An insulating coating material, comprising:
an insulating film; and
an adhesion layer on at least one side of the insulating film,
wherein
the insulating film is a polyimide film,
the polyimide film comprises PDA as a diamine component and comprises PMDA, BPDA, and BTDA as an acid dianhydride component,
a total amount of PMDA and BPDA is from 40 mol % to 90 mol % of the acid dianhydride component contained in the entire polyimide film, and
the insulating film satisfies the following formula (1):

$$a = k \times b^3 \quad (1),$$

wherein a is a loop stiffness value in g/cm of the insulating film, b is a thickness in μm of the insulating film, and k is 0.000105 or more,
wherein the loop stiffness value a is 2.4 g/cm or less, and the thickness b is 25 μm or less.
2. The insulating coating material of claim 1, wherein the adhesion layer comprises a fluorine resin.
3. An insulating coating material, comprising:
an insulating film; and
an adhesion layer on at least one side of the insulating film,
wherein
the insulating film is a polyimide film,
the polyimide film comprises PDA as a diamine component and comprises PMDA, BPDA, and BTDA as an acid dianhydride component,
a total amount of PMDA and BPDA is from 40 mol % to 9 mol % of the acid dianhydride component contained in the entire polyimide film,
the insulating film has a yield strength of 160 MPa or more where the yield strength is obtained from a stress-strain curve obtained by a tensile elastic modulus measurement, and
the insulating film has a plastic deformation region that satisfies the following relationship (1):

$$2.6 \times a + 175 < x < 6.0 \times a + 370 \quad (1),$$

wherein x is a stress in MPa in the plastic deformation region, and a is a strain in % in the plastic deformation region.
4. The insulating coating material of claim 3, wherein the insulating coating material has an abrasion property of 2.0 times or more.
5. The insulating coating material of claim 3, wherein the adhesion layer comprises a fluorine resin.

6. An insulating coating material, comprising:
an insulating film; and
an adhesion layer on at least one side of the insulating film,
wherein
the insulating film is a polyimide film,
the polyimide film comprises PDA as a diamine component and comprises PMDA, BPDA, and BTDA as an acid dianhydride component, and
a total amount of PMDA and BPDA is from 40 mol % to 9 mol % of the acid dianhydride component contained in the entire polyimide film,
wherein an abrasion property of a laminate, which is obtained by laminating and integrating members such that the adhesion layer of the insulating coating material is in contact with a conducting wire and the laminate has a structure of insulating coating material/conducting wire/insulating coating material, is 3.0 times or more, and
wherein the insulating film has a thickness of 20 μm or less.
7. The insulating coating material of claim 6, wherein the adhesion layer comprises a fluorine resin.
8. An insulated cable or an insulated wire obtained by a process comprising winding the insulating coating material of claim 1 around a conducting wire.
9. An insulated cable or an insulated wire obtained by a process comprising winding the insulating coating material of claim 3 around a conducting wire.
10. A method of evaluating an abrasion property of an insulating coating material, the method comprising:
producing a laminate obtained by laminating insulating films, adhesion layers and a conducting wire in the following order (a) or (b):
(a) insulating film—adhesion layer—conducting wire—adhesion layer—insulating film; or
(b) adhesion layer—insulating film—adhesion layer—conducting wire—adhesion layer—insulating film—adhesion layer; and
performing evaluation on the laminate,
wherein at least one insulating film in (a) and (b) is a polyimide film,
wherein the polyimide film comprises PDA as a diamine component and comprises PMDA, BPDA, and BTDA as an acid dianhydride component, and
a total amount of PMDA and BPDA is from 40 mol % to 90 mol % of the acid dianhydride component contained in the entire polyimide film.
11. The insulating coating material of claim 1,
wherein
the polyimide film comprises ODA and PDA as a diamine component,
a content of BTDA is from 10 mol % to 24 mol %, a content of PMDA is from 56 mol % to 85 mol %, and a content of BPDA is from 15 mol % to 25 mol %, each based on a total content of the acid dianhydride component of the entire polyimide film, and
a content PDA is from 40 mol % to 60 mol % based on a total content of the diamine component of the entire polyimide film.
12. The method of claim 10, wherein
the polyimide film comprises ODA and PDA as a diamine component,
a content of BTDA is from 10 mol % to 24 mol %, a content of PMDA is from 56 mol % to 85 mol %, and a content of BPDA is from 15 mol % to 25 mol %, each based on a total content of the acid dianhydride component of the entire polyimide film, and a content PDA is from 40 mol % to 60 mol % based on a total content of the diamine component of the entire polyimide film.

13. The insulating coating material of claim 1, wherein the thickness b is from 5 μm to 25 μm.

14. The insulating coating material of claim 1, wherein k is 0.000113 or more.

15. The insulating coating material of claim 1, wherein k is 0.000120 or more.

16. The insulating coating material of claim 1, wherein the loop stiffness value a is 1.6 g/cm or less.

17. The insulating coating material of claim 1, wherein the loop stiffness value a is 1.0 g/cm or less.

18. The insulating coating material of claim 1, wherein the yield strength is 175 MPa or more.

19. The insulating coating material of claim 1, wherein the yield strength is 200 MPa or more.

20. The insulating coating material of claim 1, wherein the yield strength is 230 MPa or more.

* * * * *